United States Patent
Sawamura

(10) Patent No.: US 8,355,290 B2
(45) Date of Patent: Jan. 15, 2013

(54) SEMICONDUCTOR MEMORY AND SYSTEM

(75) Inventor: Takahiro Sawamura, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 254 days.

(21) Appl. No.: 12/787,904

(22) Filed: May 26, 2010

(65) Prior Publication Data

US 2010/0302889 A1 Dec. 2, 2010

(30) Foreign Application Priority Data

Jun. 1, 2009 (JP) ................................ 2009-131839

(51) Int. Cl.
*G11C 7/00* (2006.01)

(52) U.S. Cl. .............. 365/222; 365/233.11; 365/233.12; 365/230.06; 365/241; 365/233.1

(58) Field of Classification Search .................. 365/222, 365/233.1, 233.11, 233.12, 230.06, 241
See application file for complete search history.

(56) References Cited

U.S. PATENT DOCUMENTS

| 2002/0051396 A1 | 5/2002 | Higashiho et al. |
| 2005/0047239 A1* | 3/2005 | Takahashi et al. ............ 365/222 |

FOREIGN PATENT DOCUMENTS

| JP | 11-31383 A | 2/1999 |
| JP | 11-273340 A | 10/1999 |
| JP | 2002-140891 A | 5/2002 |
| JP | 2003-115189 A | 4/2003 |

\* cited by examiner

*Primary Examiner* — Thong Q Le
(74) *Attorney, Agent, or Firm* — Arent Fox LLP

(57) ABSTRACT

A semiconductor memory includes a plurality of memory cells, a refresh request generator circuit for generating a refresh request signal to refresh the plurality of memory cells based on a number of clock cycles elapsed in a clock signal, a clock cycle detector circuit for detecting the clock cycle of the clock signal, and a refresh controller circuit for controlling a number of memory cells to refresh from among the plurality of memory cells, in accordance with the detected clock cycle.

11 Claims, 21 Drawing Sheets

SEMICONDUCTOR MEMORY AND SYSTEM

CROSS REFERENCE TO RELATED APPLICATIONS

This application is based upon and claims the benefit of priority from the prior Japanese Patent Application No. 2009-131839, filed on Jun. 1, 2009, the entire contents of which is incorporated herein by reference.

FIELD

The aspects of the invention discussed herein relate to semiconductor memory and a system having dynamic memory cells.

BACKGROUND

In order to retain data written to dynamic memory cells, semiconductor memory, such as dynamic random access memory (DRAM), may perform a periodic refresh operation. In addition, the data retention characteristics of dynamic memory cells may worsen with increasing chip temperature. For this reason, when the chip temperature is high, the refresh cycle is shortened.

For example, Japanese Laid-Open Patent Publication No. 2003-115189 discloses a controller that controls the operation of semiconductor memory. By monitoring a self-refresh from the semiconductor memory, the controller may adjust the generation cycle of a refresh request signal that is supplied to the semiconductor memory. In other examples, Japanese Laid-Open Patent Publication Nos. 2002-140891, 11-31383, and 11-273340 disclose technology wherein, given a correlation between the clock cycle and the chip temperature, the refresh cycle may be shortened when the clock cycle is short and the chip temperature is high.

For example, in semiconductor memory that generates a refresh request signal using a clock signal, the generation cycle of the refresh request signal may be lengthened when the clock cycle lengthens. When the clock cycle is set long, the refresh interval of the dynamic memory cells lengthens, which may make data retention problematic.

SUMMARY

According to an aspect of the invention, a semiconductor memory may include a plurality of memory cells, a refresh request generator circuit for generating a refresh request signal to refresh the plurality of memory cells based on a number of clock cycles elapsed in a clock signal, a clock cycle detector circuit for detecting the clock cycle of the clock signal, and a refresh controller circuit for controlling a number of memory cells to refresh from among the plurality of memory cells, in accordance with the detected clock cycle.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
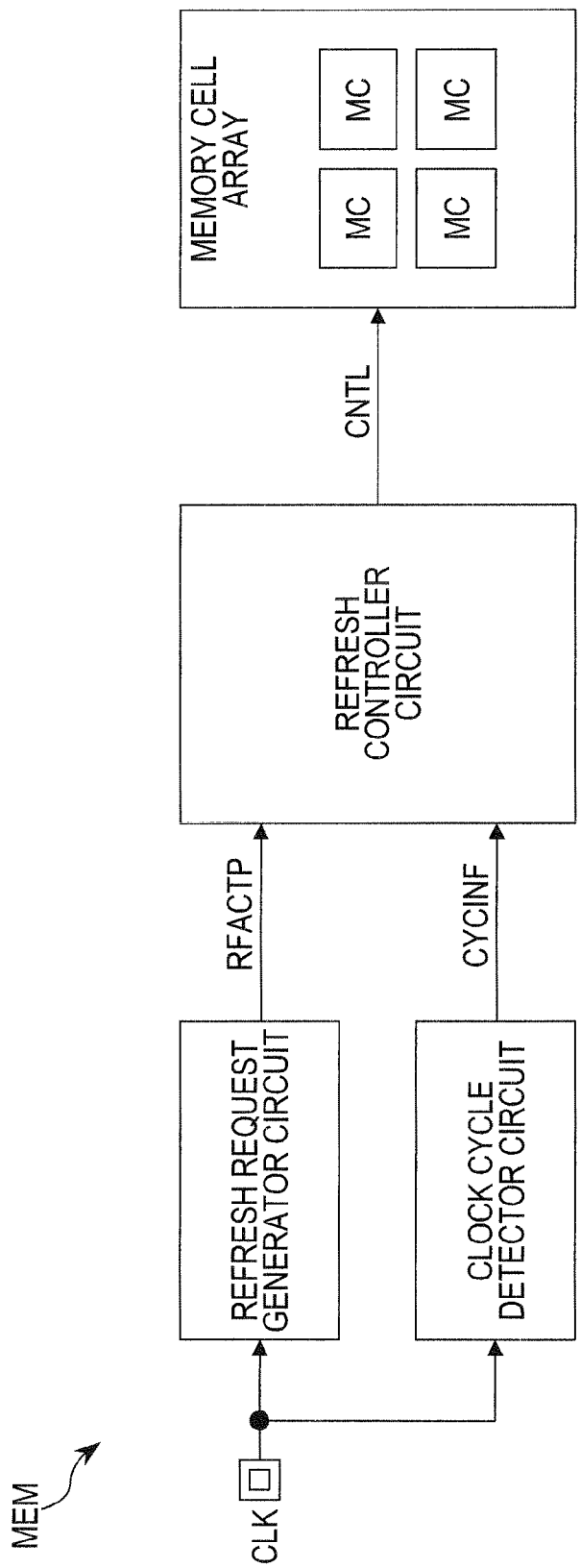
FIG. 1 illustrates first semiconductor memory in accordance with an exemplary aspect of the invention.

The bolded signal lines illustrated in the drawings indicate a plurality of signal lines. In addition, some of the blocks coupled by bolded lines include a plurality of circuits. A signal line that transmits a particular signal is indicated using a reference symbol identical to the signal name. Signals whose names end in "B" or start with "/" represent negative logic. Signals whose names end in "P" represent pulse signals. A double square in the drawing represents an external terminal. The external terminal may be, for example, a pad on the semiconductor chip, or a lead of a package mounted on the semiconductor chip. A signal supplied via an external terminal is indicated using a reference symbol identical to the terminal name.

FIG. 1 illustrates a first semiconductor memory MEM in accordance with an exemplary aspect of the invention. The semiconductor memory MEM includes a refresh request generator circuit, a clock cycle detector circuit, a refresh controller circuit, and a memory cell array that includes a plurality of dynamic memory cells MC. The refresh request generator circuit generates a refresh request signal RFACTP for refreshing the dynamic memory cells MC each time a certain number of clock cycles elapses in the clock signal CLK. The clock cycle detector circuit detects the cycle of the clock signal CLK, and outputs the information CYCINF, which indicates the clock cycle of the detected clock signal CLK. Based on the clock cycle information CYCINF, the refresh controller circuit outputs an access control signal CNTL for increasing or decreasing the number of dynamic memory cells MC to refresh in response to the refresh request signal RFACTP.

For example, when the cycle of the clock signal CLK has increased, the number of dynamic memory cells MC to refresh in response to the refresh request signal RFACTP is increased. In so doing, all of the dynamic memory cells MC in the memory cell array may be refreshed within a certain period of time, without depending on the clock cycle. As a result, the data within in the dynamic memory cells MC may be retained without depending on the clock cycle.

Figure 2:
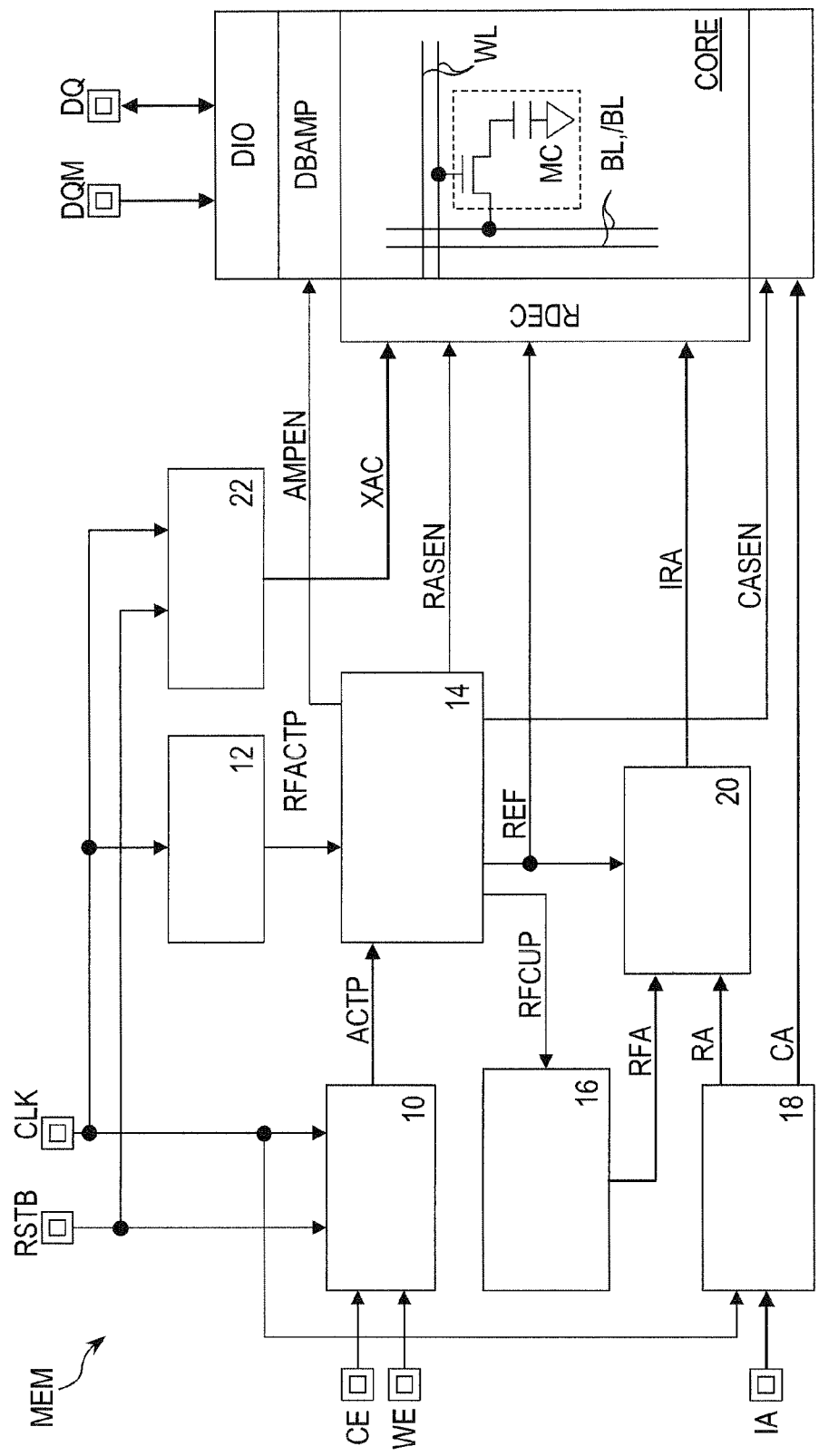
FIG. 2 illustrates second semiconductor memory in accordance with an exemplary aspect of the invention.

FIG. 2 illustrates a second semiconductor memory MEM in accordance with an exemplary aspect of the invention. Elements identical to those described in FIG. 1 are indicated by identical reference symbols, and detailed description of such elements is hereinafter omitted.

By way of example, the semiconductor memory MEM may be dynamic random access memory (DRAM), which operates in sync (i.e., synchronization) with a clock signal CLK. The semiconductor memory MEM includes a command decoder 10, a clock counter 12, a core controller circuit 14, a refresh address counter 16, an address latch 18, an address selector 20, a clock cycle counter 22, a row decoder RDEC, a column decoder CDEC, a data bus amp DBAMP, a data input/output circuit DIO, and a memory core CORE.

While a reset signal RSTB is high, the command decoder 10 receives a chip-enable signal CE and a write-enable signal WE in sync with a clock signal CLK. Upon receiving a high chip-enable signal CE and a low write-enable signal WE, the command decoder 10 outputs a reset signal RSTB, which is a readout command for executing readout operations. Upon receiving a high chip-enable signal CE and a high write-enable signal WE, the command decoder 10 outputs an access request signal ACTP, which is a write command for executing write operations.

The clock counter 12 counts pulses of the clock signal CLK, and outputs the refresh request signal RFACTP each time a certain number of clock pulses is counted. The clock counter 12 operates as a refresh request generator circuit, which generates a refresh request signal RFACTP each time a certain number of clock cycles elapses in the clock signal CLK. For example, the clock counter 12 may output a refresh request signal RFACTP in sync with the falling edge of the clock signal CLK.

In response to the access request signal ACTP, the core controller circuit 14 outputs the access control signals RASEN and CASEN, as well as a timing signal AMPEN in order to execute various access operations, such as readout or write operations with respect to the memory core CORE. In response to the refresh request signal RFACTP, the core controller circuit 14 outputs an access control signal RASEN and a refresh signal REF, while also outputting a count up signal RFCUP, in order to execute a refresh operation of the memory core CORE. During a refresh operation, the access control signal CASEN and AMPEN are not output.

Operating in sync with the count up signal RFCUP, the refresh address counter 16 increments a refresh address signal RFA by 1. The refresh address signal RFA indicates the dynamic memory cells MC to be refreshed. More specifically, the refresh address signal RFA is a row address signal that indicates word lines to which dynamic memory cells MC are coupled.

The address latch 18 latches an external address signal IA in sync with the clock signal CLK, and outputs the result as a row address signal RA and a column address signal CA. The row address signal RA is used for selecting word lines. The column address signal CA is used for selecting bit line pairs BL and /BL.

When the refresh signal REF is low, the address selector 20 outputs the row address signal RA as an internal row address signal IRA. When the refresh signal REF is high, the address selector 20 outputs the refresh address signal RFA as an internal row address signal IRA.

The clock cycle counter 22 operates while the reset signal RSTB is low, and detects the clock cycle of the clock signal CLK. The clock cycle counter 22 outputs a counter value XAC indicating the detected clock cycle. The clock cycle counter 22 operates as a clock cycle detector circuit, which detects the cycle of a clock signal.

While the access control signal RASEN is high, the row decoder RDEC decodes the internal row address signal IRA in order to select word lines WL. The number of word lines WL selected at the same time is modified according to value of the counter value XAC.

While the access control signal CASEN is high, the column decoder CDEC decodes the column address signal CA in order to select bit line pairs BL and /BL. While the access control signal AMPEN is high, the data bus amp DBAMP amplifies readout data from the memory core CORE, or alternatively, amplifies write data supplied to the memory core CORE.

The data input/output circuit DIO outputs readout data output from the memory core CORE via the data bus amp DBAMP during readout operations to a data terminal DQ. The data input/output circuit DIO also supplies write data supplied to the data terminal DQ during write operations to the memory core CORE via the data bus amp DBAMP. A data mask signal DQM is supplied to the semiconductor memory MEM when masking the bits of a portion of either the readout data or the write data.

The memory core CORE includes, for example, a plurality of dynamic memory cells MC arranged in a matrix layout, a plurality of word lines WL coupled to the rows of dynamic memory cells MC, and a plurality of bit line pairs BL and /BL coupled to the columns of dynamic memory cells MC. The dynamic memory cells MC each include a capacitor for storing data as electric charge, and a transfer transistor for coupling one end of the capacitor to a bit line BL or /BL. The other end of the capacitor is coupled to a reference voltage line. Similarly to typical DRAM, the memory core CORE also includes components such as precharge circuits for the bit lines BL and /BL, sense amps, and column switches.

In the present aspect, the memory core CORE includes a plurality of memory blocks having a certain number of word lines WL. Each memory block includes an independently operating precharge circuit, sense amp, and column switch.

Figure 3:
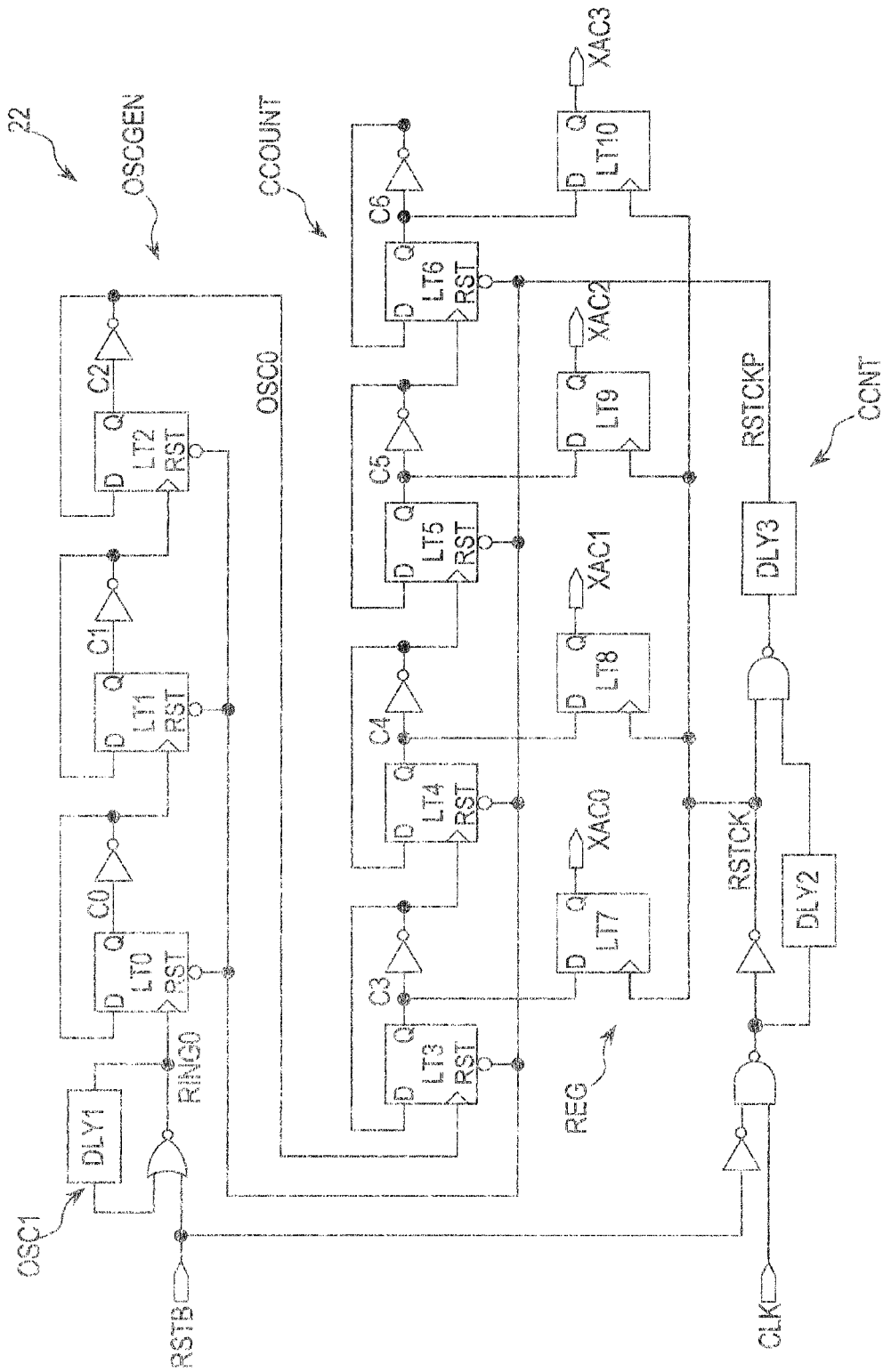
FIG. 3 illustrates an example of the clock cycle counter illustrated in FIG. 2 in accordance with an exemplary aspect of the invention.

FIG. 3 illustrates an example of the clock cycle counter 22 illustrated in FIG. 2 in accordance with an exemplary aspect of the invention. The clock cycle counter 22 includes an oscillating signal generator circuit OSCGEN, a clock counter CCOUNT, a register REG, and a counter controller circuit CCNT.

The oscillating signal generator circuit OSCGEN includes an oscillator OSC1 and three latch circuits LT0 to LT2. The oscillator OSC1 feeds the output of a NOR gate back into the input on one side of the NOR gate via a delay circuit DLY1. When a low reset signal RSTB is received at the input on the other side of the NOR gate, the oscillator OSC1 generates an oscillating signal RING0 that is shorter than the cycle of the clock signal CLK. When the reset signal RSTB is high, the oscillating signal RING0 is fixed at a low level.

The latch circuits LT0 to LT2 are coupled in series. The latch circuits LT0 to LT2 output, from output terminals Q, division signals C0 to C2 obtained by successively dividing the oscillating signal RING0. The latch circuit LT0 and LT1 to LT2 receive, at their data inputs, signals obtained by inverting the logic of the division signals C0 and C1 to C2, respectively. The latch circuits LT1 and LT2 receive, at their data inputs D, signals obtained by inverting the division signals C0 and C1, respectively. The oscillating signal generator circuit OSCGEN outputs the oscillating signal OSC0 from the latch circuit LT2 to the clock counter CCOUNT.

The clock counter CCOUNT includes latch circuits LT3 to LT6, coupled in series. The latch circuit LT3 receives the oscillating signal OSC0 from the oscillating signal generator circuit OSCGEN. The division signals C3 to C6 output from the latch circuits LT3 to LT6 are supplied to the register REG. The latch circuits LT3 to LT6 are coupled to each other in the same way as the latch circuits LT0 to LT2. The latch circuits LT0 to LT6 are reset to logical 0 upon receiving a low reset clock pulse signal RSTCKP. The clock counter CCOUNT counts clock cycle in the form of the number of pulses of the oscillating signal OSC0 occurring during the rising edge of the clock signal CLK. Herein, the clock counter CCOUNT may also count the clock cycle in the form of the number of pulses of the oscillating signal OSC0 occurring during the falling edge of the clock signal CLK.

The register REG includes latch circuits LT7 to LT10, which respectively receive the division signals C3 to C6. The latch circuits LT7 to LT10 latch the logical level of the division signals C3 to C6 in sync with the reset clock signal RSTCK, and outputs the result as a counter signal XAC (i.e., counter values XAC0 to XAC3).

The counter controller circuit CCNT includes a logic circuit that generates a reset clock signal RSTCK synchronized with the clock signal CLK while the reset signal RSTB is low. In addition, the counter controller circuit CCNT includes a logic circuit that generates a negative-logic reset clock pulse signal RSTCKP synchronized with the rising edge of the clock signal CLK while the reset signal RSTB is low. By means of a delay circuit DLY2, the pulse width of the reset clock pulse signal RSTCKP is determined. By means of a delay circuit DLY3, the amount of time is determined between the rising edge of the reset clock signal RSTCK and the outputting of the reset clock pulse signal RSTCKP.

Figure 4:
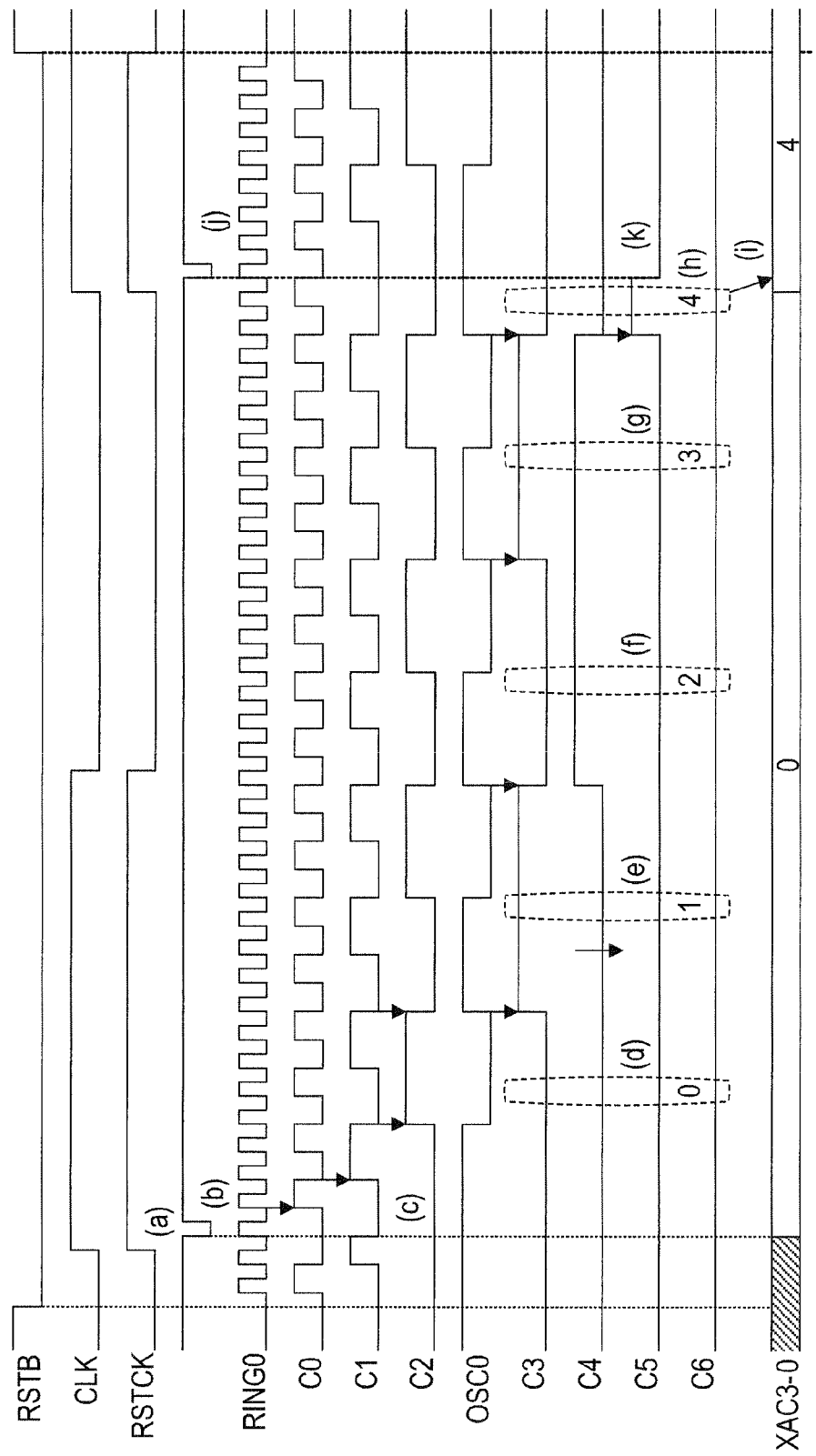
FIG. 4 illustrates an operation of the clock cycle counter illustrated in FIG. 3 in accordance with an exemplary aspect of the invention.

FIG. 4 illustrates an operation of the clock cycle counter 22 illustrated in FIG. 3 in accordance with an exemplary aspect of the invention. In FIG. 4, the reset period corresponding to a low reset signal RSTB is approximately 1.5 cycles of the clock signal CLK. In practice, the reset period may be one or more cycles of the clock signal CLK. More specifically, the reset period may be a period during which the reset clock pulse signal RSTCKP is output two or more times.

As illustrated at (a) in FIG. 4, once the reset signal RSTB is activated at the low level and the semiconductor memory MEM is set to the reset state, a reset clock signal RSTCK synchronized with the clock signal CLK is generated. As illustrated at (b) in FIG. 4, a negative-logic reset clock pulse signal RSTCKP is generated after a delay substantially equal to a certain amount of time from the rising edge of the clock signal CLK. As illustrated at (c) in FIG. 4, the latch circuits LT0 to LT6 are reset by the reset clock pulse signal RSTCKP, and the division signals C0 to C6 are set to logical 0.

Subsequently, as illustrated at (d), (e), (f), (g), and (h) in FIG. 4, the latch circuits LT0 to LT6 operate in sequence, and the logical value of the division signals C0 to C6 is increased until the next reset clock pulse signal RSTCKP is output. The logical value of the division signals C6 to C3 that correspond to the counter values XAC3 to XAC0 is successively increased in sync with the rising edge of the oscillating signal OSC0. As illustrated at (i) in FIG. 4, the logical value of the division signals C6 to C3 is latched by the latch circuits LT10 to LT7 in sync with the reset clock signal RSTCK, and output as the counter values XAC3 to XAC0. In this example, the counter values XAC3 to XAC0 corresponding to one cycle of the clock signal CLK is measured to be 4. Once the reset signal RSTB is deactivated at the high level, the register REG stores the detected clock cycle (i.e., the counter values XAC3 to XAC0).

As illustrated at (j) and (k) in FIG. 4, once the reset clock signal RSTCK is output, the reset clock pulse signal RSTCKP is output, and the latch circuits LT0 to LT6 are reset. When the reset period is two or more cycles of the clock signal CLK, the last measured clock cycle is stored as the counter values XAC3 to XAC0.

Once the reset signal RSTB is deactivated, the cycle of the clock signal CLK supplied to the semiconductor memory MEM is no longer modified. By measuring the clock cycle during the reset period, access operations of the semiconductor memory MEM are initiated immediately after cancelling the reset signal RSTB. As a result, performance is improved for the system provided with the semiconductor memory MEM.

Figure 5:
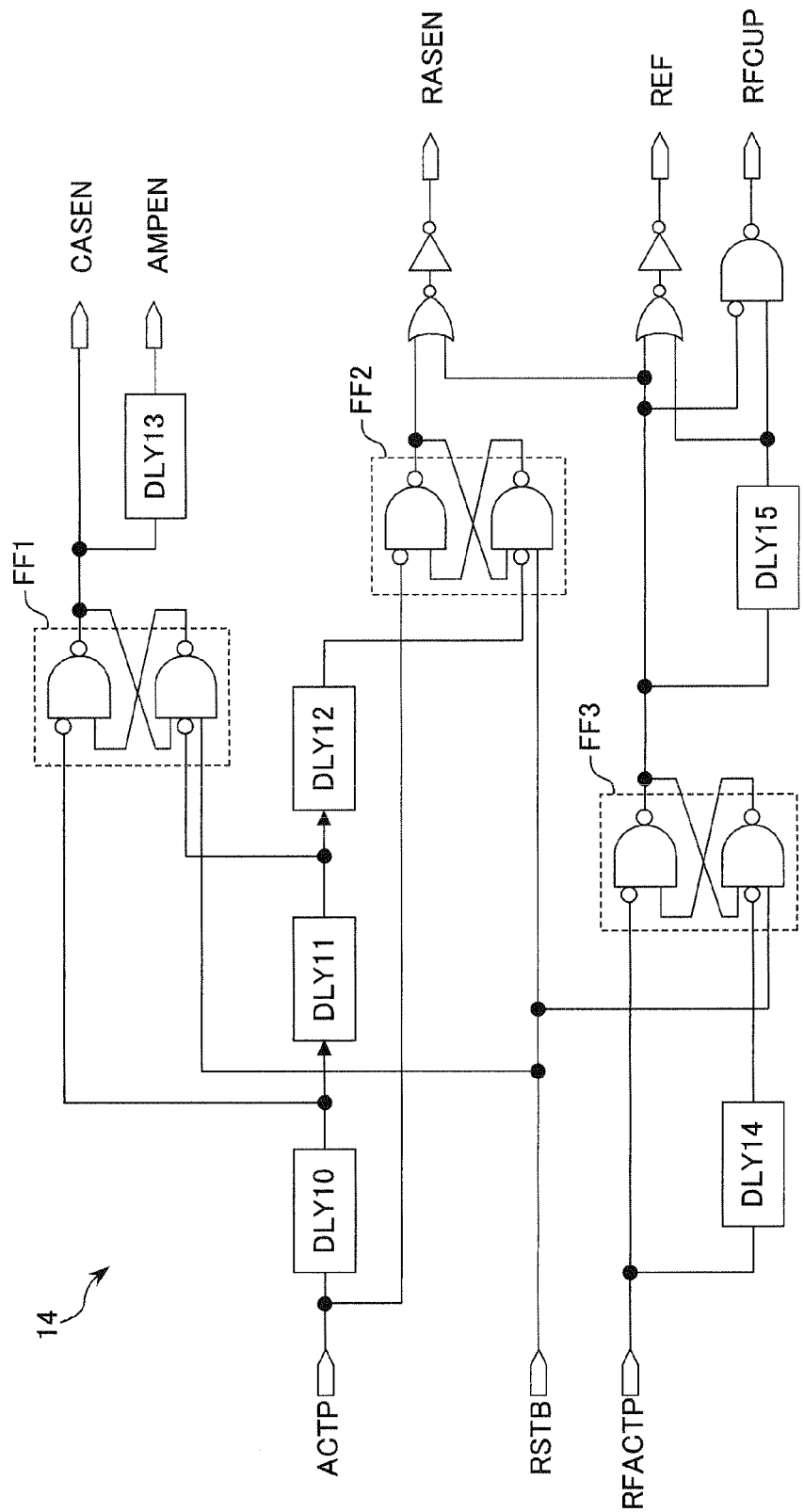
FIG. 5 illustrates an example of the core controller circuit illustrated in FIG. 2 in accordance with an exemplary aspect of the invention.

FIG. 5 illustrates an example of the core controller circuit 14 illustrated in FIG. 2 in accordance with an exemplary aspect of the invention. The core controller circuit 14 includes flip-flops FF1 to FF3 and delay circuits DLY10 to DLY15. While the reset signal RSTB is active, the flip-flops FF1 to FF3 are reset, and a low level is output. In the description hereinafter, the delay times of the delay circuits DLY10 to DLY15 are represented by DLY10 to DLY15, respectively. The flip-flop FF1 controls activation and deactivation of the access control signals CASEN and AMPEN. The flip-flop FF2 controls activation and deactivation of the access control signal RASEN. The flip-flop FF3 controls activation and deactivation of the refresh signal REF.

The access control signal CASEN is activated after a delay time DLY10 starting from the activation of the access request signal ACTP, and deactivated after another delay time DLY11. Output of the access control signal AMPEN trails that of the access control signal CASEN by a delay time DLY13. The access control signal RASEN is activated in sync with the access request signal ACTP, and deactivated after a total time substantially equal to the sum of the delay times DLY10, DLY11, and DLY12 starting from the activation of the access request signal ACTP. In addition, the access control signal RASEN is activated in sync with the refresh request signal RFACTP, and deactivated after a delay time DLY14 starting from the activation of the refresh request signal RFACTP. The delay time DLY14 is nearly substantially equal to the total time substantially equal to the sum of the delay times DLY10, DLY11, and DLY12.

The refresh signal REF is activated in sync with the refresh request signal RFACTP, and deactivated after a delay time DLY14 starting from the activation of the refresh request signal RFACTP. The count up signal RFCUP is activated in sync with the falling edge of the refresh signal REF. The pulse width of the count up signal RFCUP is substantially equal to the difference between the activation period of the refresh signal REF and a delay time DLY15.

Figure 6:
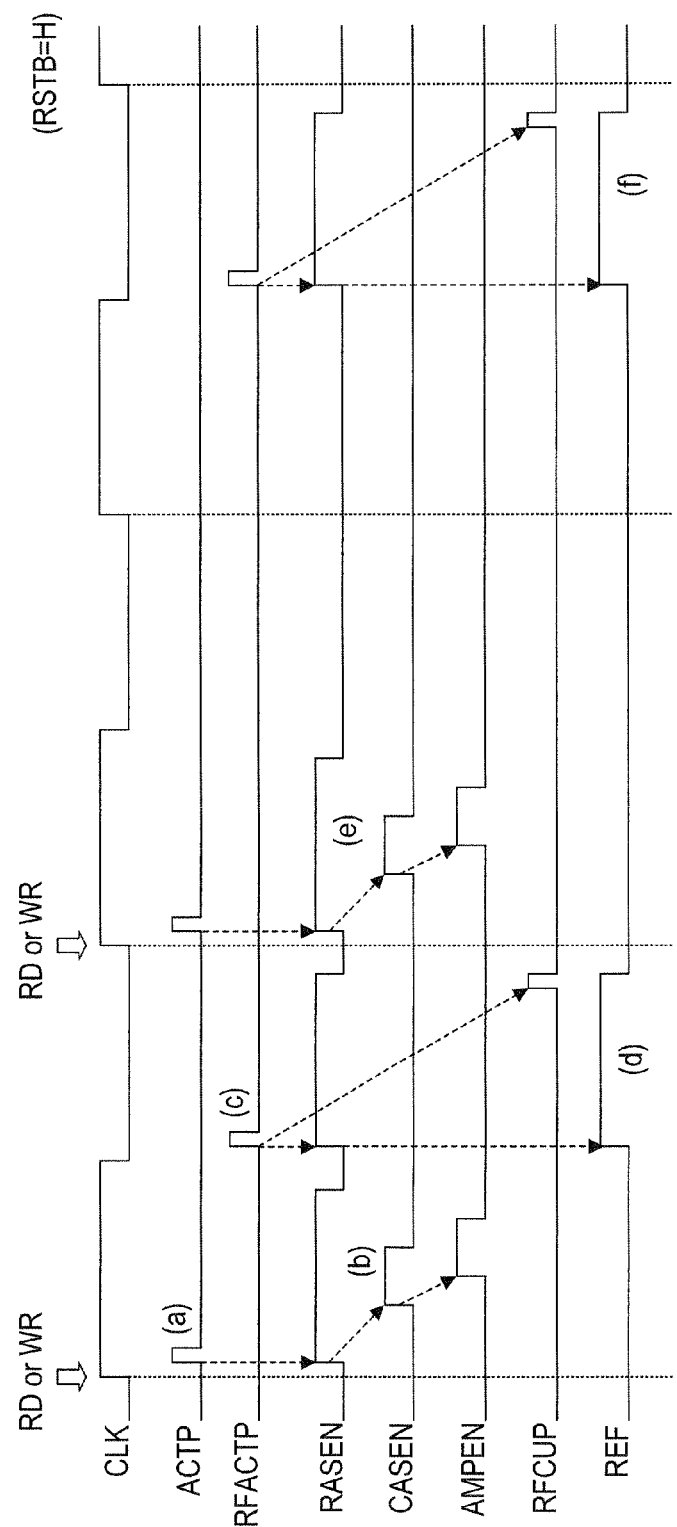
FIG. 6 illustrates an operation of the core controller circuit illustrated in FIG. 5 in accordance with an exemplary aspect of the invention.

FIG. 6 illustrates an operation of the core controller circuit 14 illustrated in FIG. 5 in accordance with an exemplary aspect of the invention. As illustrated at (a) in FIG. 6, when a readout command RD or a write command WR is recognized, the command decoder 10 illustrated in FIG. 2 outputs an access request signal ACTP in sync with the rising edge of the clock signal CLK. In so doing, as illustrated at (b) in FIG. 6, the access control signals RASEN, CASEN, and AMPEN are successively activated for the memory block specified by the row address signal RA, and access operations (i.e., readout operations or write operations) are executed.

For example, with readout operations, the word lines WL of the memory block specified by the row address signal RA are activated, which causes data to be read out from the dynamic memory cells MC onto a bit line BL or /BL, and then amplified by a sense amp. The amplification period of the sense amp is nearly equal to the activation period of the access control signal CASEN. Subsequently, a column switch CSW corresponding to the column address signal CA is switched on in sync with the access control signal CASEN, and the readout data that was amplified by the sense amp is supplied to the data bus amp DBAMP. Operating in sync with the access control signal AMPEN, the data bus amp DBAMP further amplifies the readout data and outputs to a data terminal DQ.

As illustrated at (c) in FIG. 6, the clock counter 12 in FIG. 2 outputs a refresh request signal RFACTP in sync with the falling edge of the clock signal CLK. In so doing, as illustrated at (d) in FIG. 6, the access control signal RASEN and the refresh signal REF are activated, and refresh operations are executed. The access control signal RASEN functions as a refresh control signal for refreshing the dynamic memory cells MC in response to the refresh signal REF. The logic circuit that generates the access control signal RASEN includes the functions of a control signal generator circuit that generates a refresh control signal.

Herein, the activation period of the access control signal RASEN expresses the activation period of the word lines WL, the access operation period, or the refresh operation period. The activation period of the refresh signal REF also expresses the refresh operation period. In the present aspect, the access operations corresponding to a single readout command RD or write command WR are executable in half a cycle of the clock signal CLK. Similarly, the refresh operations corresponding to a single refresh request signal RFACTP are executable in half a cycle of the clock signal CLK. As a result, it is possible to supply the semiconductor memory MEM with a readout command RD or a write command WR every clock cycle.

As illustrated at (e) in FIG. 6, the refresh request signal RFACTP is output once in a plurality of clock cycles. When the refresh request signal RFACTP is not output in the clock cycle where the access request signal ACTP is output, only access operations in response to the access request signal ACTP are executed. As illustrated at (f) in FIG. 6, when neither readout command RD nor a write command WR is supplied in the clock cycle where the refresh request signal RFACTP is output, only refresh operations in response to the refresh request signal RFACTP are executed.

Figure 7:
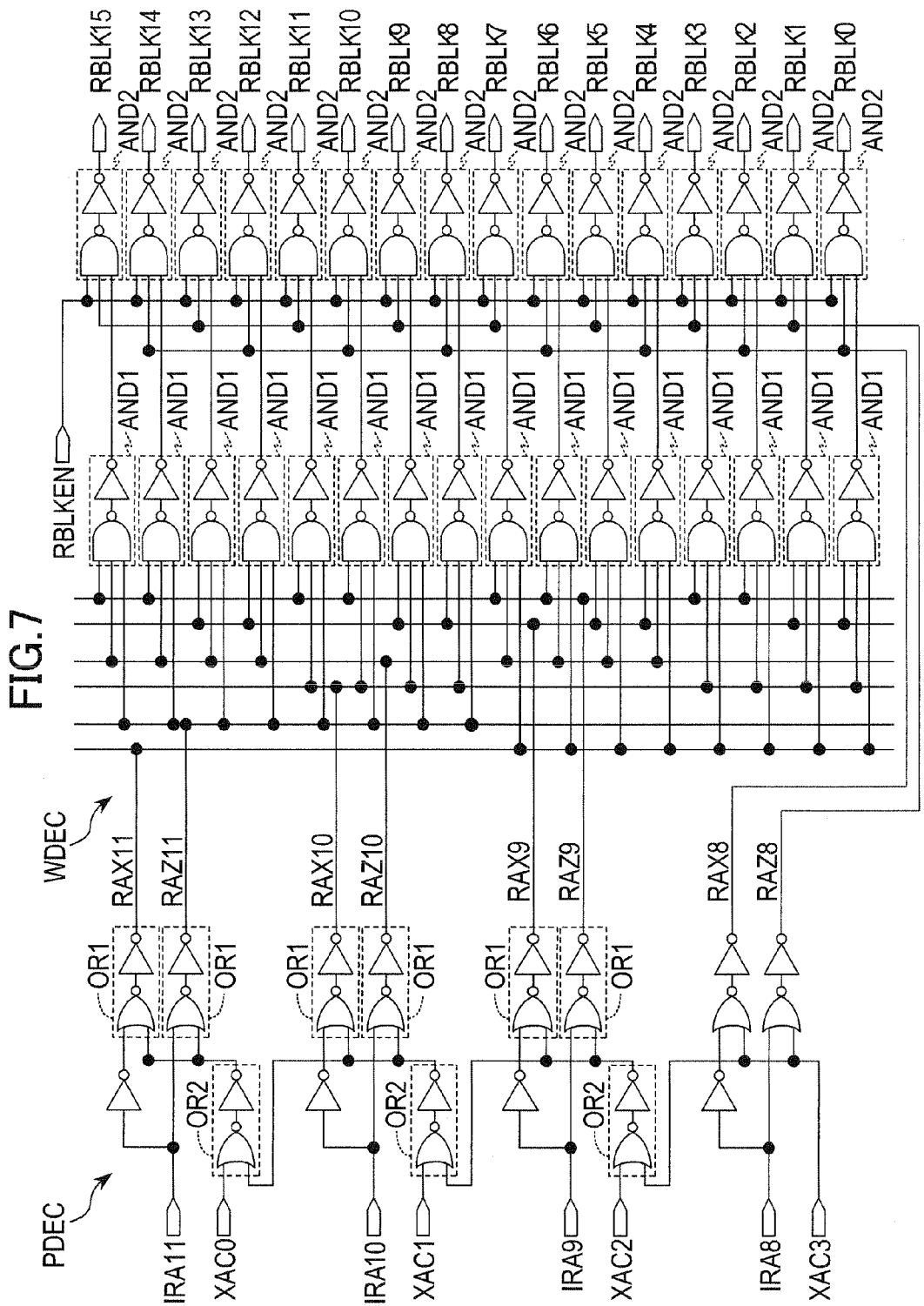
FIG. 7 illustrates an example of the row decoder illustrated in FIG. 2 in accordance with an exemplary aspect of the invention.

FIG. 7 illustrates an example of the row decoder RDEC illustrated in FIG. 2 in accordance with an exemplary aspect of the invention. By way of example, the memory core CORE includes a plurality of memory blocks RBLK (RBLK0 to RBLK15). Each of the memory blocks RBLK0 to RBLK15 includes 256 word lines WL. The memory blocks RBLK0 to RBLK15 are selected by the upper internal row address signals IRA8 to IRA11 (i.e., RA8 to RA11 or RFA8 to RFA11). RBLK0 to RBLK15 in FIG. 7 represent the block decode signals for selecting the memory blocks RBLK0 to RBLK15. The word lines WL of each of the memory blocks RBLK0 to RBLK15 are selected by the decoder circuits of the lower internal row address signal IRA0 to IRA7 (i.e., RA0 to RA7 or RFA0 to RFA7). The memory blocks RBLK0 to RBLK15 include independent sense amps, and independently execute access operations and refresh operations. In other words, refresh operations are simultaneously executed in a plurality of memory blocks RBLK.

The row decoder RDEC includes a pre-decoder PDEC and a word decoder WDEC (i.e., a block decoder). The pre-decoder PDEC includes OR circuits OR1 that take a single-phase row address signal IRA, such as IRA1, and convert the signal into complementary pre-decode signals RAZ and RAX, such as RAZ11 and RAX11. In addition, the pre-decoder PDEC includes OR circuits OR2 for taking both of the complementary pre-decode signals RAZ and RAX, such as RAZ11 and RAX11, and forcibly setting their signal levels high (i.e., active), regardless of the logical level of the row address signals IRA. The OR circuits OR2 are coupled in series from the lower to the upper row address signals IRA. During refresh operations, each OR circuit OR2 outputs high upon receiving a high corresponding counter value XAC, such as XAC0. Alternatively, each OR circuit OR2 outputs high upon receiving a high level from the OR circuit OR2 corresponding to a lower row address signal IRA, such as RA10. During readout operations or write operations, the counter value XAC from the clock cycle counter 22 is masked, and the OR circuits OR2 receive a low-level counter value XAC.

When the counter value XAC3 is low, the pre-decode signal RAZ8 is the same logical level as the row address signal IRA8, while the pre-decode signal RAX8 is the inverse logical level of the row address signal IRA8. When the counter value XAC3 is high, the pre-decode signals RAZ8 to RAZ11 and RAX8 to RAX11 are set high, regardless of the logical level of the row address signals IRA8 to IRA11. In other words, the four bit-pairs of the complementary pre-decode signals RAZ and RAX are set to the active level.

When the counter values XAC2 to XAC3 are low, the pre-decode signal RAZ9 is the same logical level as the row address signal IRA9, while the pre-decode signal RAX9 is the inverse logical level of the row address signal IRA9. When the counter value XAC2 is high, the pre-decode signals RAZ9 to RAZ11 and RAX9 to RAX11 are set to a constant high level, regardless of the logical level of the row address signals IRA9 to IRA11. In other words, the three bit-pairs of the complementary pre-decode signals RAZ and RAX are set to the active level.

When the counter values XAC1 to XAC3 are low, the pre-decode signal RAZ10 is the same logical level as the row address signal IRA10, while the pre-decode signal RAX10 is the inverse logical level of the row address signal IRA10. When the counter value XAC1 is high, the pre-decode signals RAZ10 to RAZ11 and RAX10 to RAX11 are set high, regardless of the logical level of the row address signals IRA10 to IRA11. In other words, the two bit-pairs of the complementary pre-decode signals RAZ and RAX are set to the active level.

When the counter values XAC0 to XAC3 are low, the pre-decode signal RAZ11 is the same logical level as the row address signal IRA11, while the pre-decode signal RAX11 is the inverse logical level of the row address signal IRA11. When the counter value XAC0 is high, the pre-decode signals RAZ11 and RAX11 are set high, regardless of the logical level of the row address signal IRA11. In other words, the one bit-pair of the complementary pre-decode signals RAZ and RAX is set to the active level.

The word decoder WDEC includes corresponding AND circuits AND1 and AND2 for each of the memory blocks RBLK0 to RBLK15. The AND circuits AND1 receive one among the pre-decode signals RAZ11 and RAX11, one among the pre-decode signals RAZ10 and RAX10, and one among the pre-decode signals RAZ9 and RAX9. The AND circuits AND2 receive the output of their corresponding AND circuits AND1, one among the pre-decode signals RAZ8 and RAX8, and a block access control signal RBLKEN. The block access control signal RBLKEN is generated by the core controller circuit 14 in sync with the access control signal RASEN.

When the counter values XAC0 to XAC3 are low, one of the block decode signals RBLK0 to RBLK15 is selected according to the row address signals IRA8 to IRA11, and the corresponding one memory block RBLK is activated. When the counter value XAC0 is high and the counter values XAC1 to XAC3 are low, the row address signal IRA11 is degenerated. At this point, two of the block decode signals RBLK0 to RBLK15 are selected according to the row address signals IRA8 to IRA11, and the corresponding two memory blocks RBLK are activated. In other words, one memory block RBLK corresponding to the row address signals IRA8 to IRA11, as well as another memory block RBLK not corresponding to the row address signals IRA8 to IRA11, are simultaneously selected.

When the counter values XAC0 to XAC1 are high and the counter values XAC2 to XAC3 are low, the row address signals IRA11 to IRA10 are degenerated. At this point, four of the block decode signals RBLK0 to RBLK15 are selected according to the row address signals IRA8 to IRA11, and the corresponding four memory blocks RBLK are activated. In other words, one memory block RBLK corresponding to the row address signals IRA8 to IRA11, as well as another three memory blocks RBLK not corresponding to the row address signals IRA8 to IRA11, are simultaneously selected.

Figure 10:
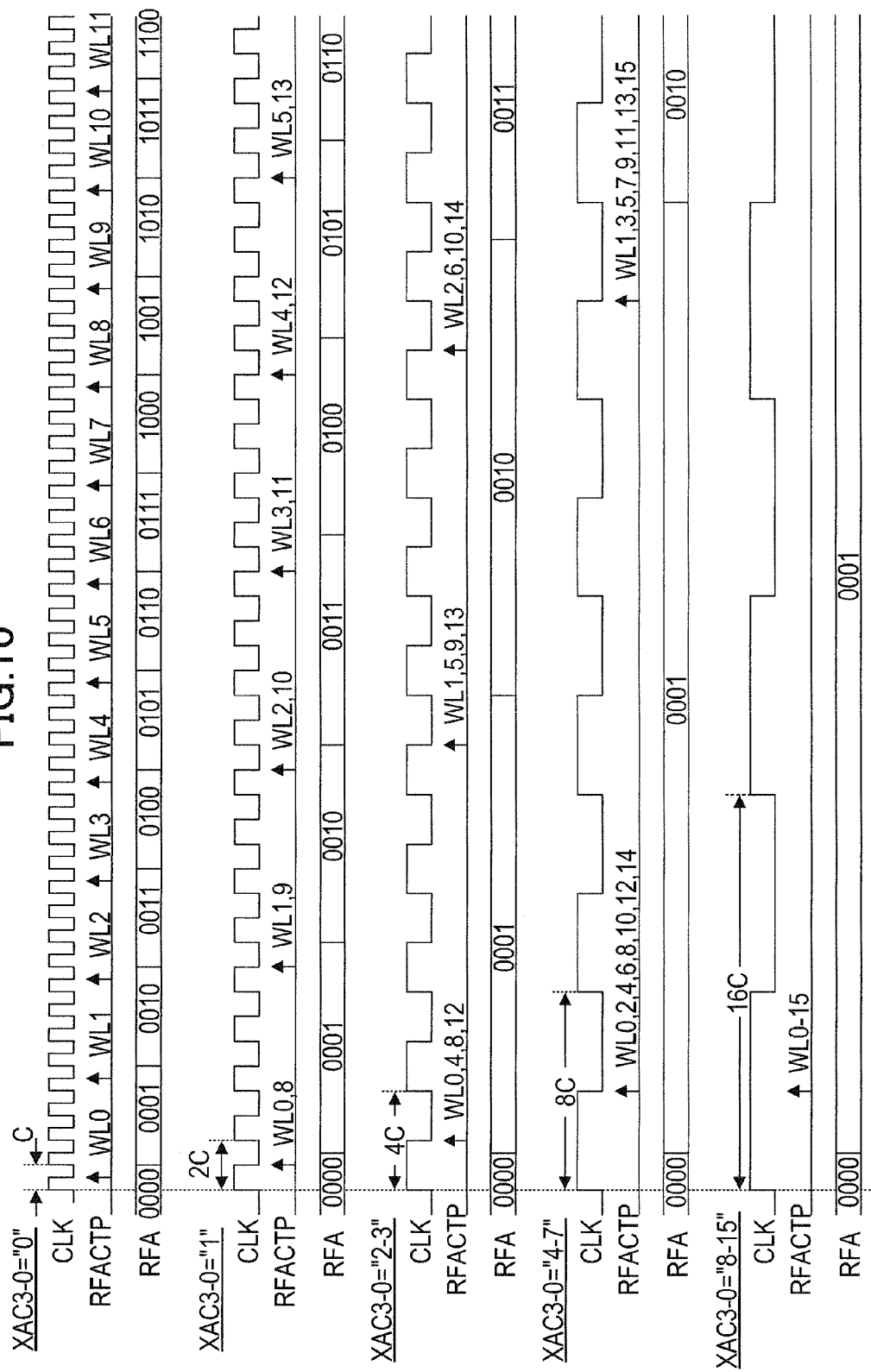
FIG. 10 illustrates an operation of the semiconductor memory illustrated in FIG. 2 in accordance with an exemplary aspect of the invention.

When the counter values XAC0 to XAC2 are high and the counter value XAC3 is low, the row address signals IRAN to IRA9 are degenerated, and eight memory blocks RBLK are simultaneously selected according to the row address signals IRA8 to IRA11. When the counter values XAC0 to XAC3 are high, the row address signals IRA11 to IRA8 are degenerated, and all memory blocks RBLK are simultaneously selected, regardless of the row address signals IRA8 to IRA11. In so doing, it becomes possible to simultaneously refresh a plurality of memory blocks RBLK in response to a single refresh request signal RFACTP, as illustrated in FIG. 10.

Figure 8:
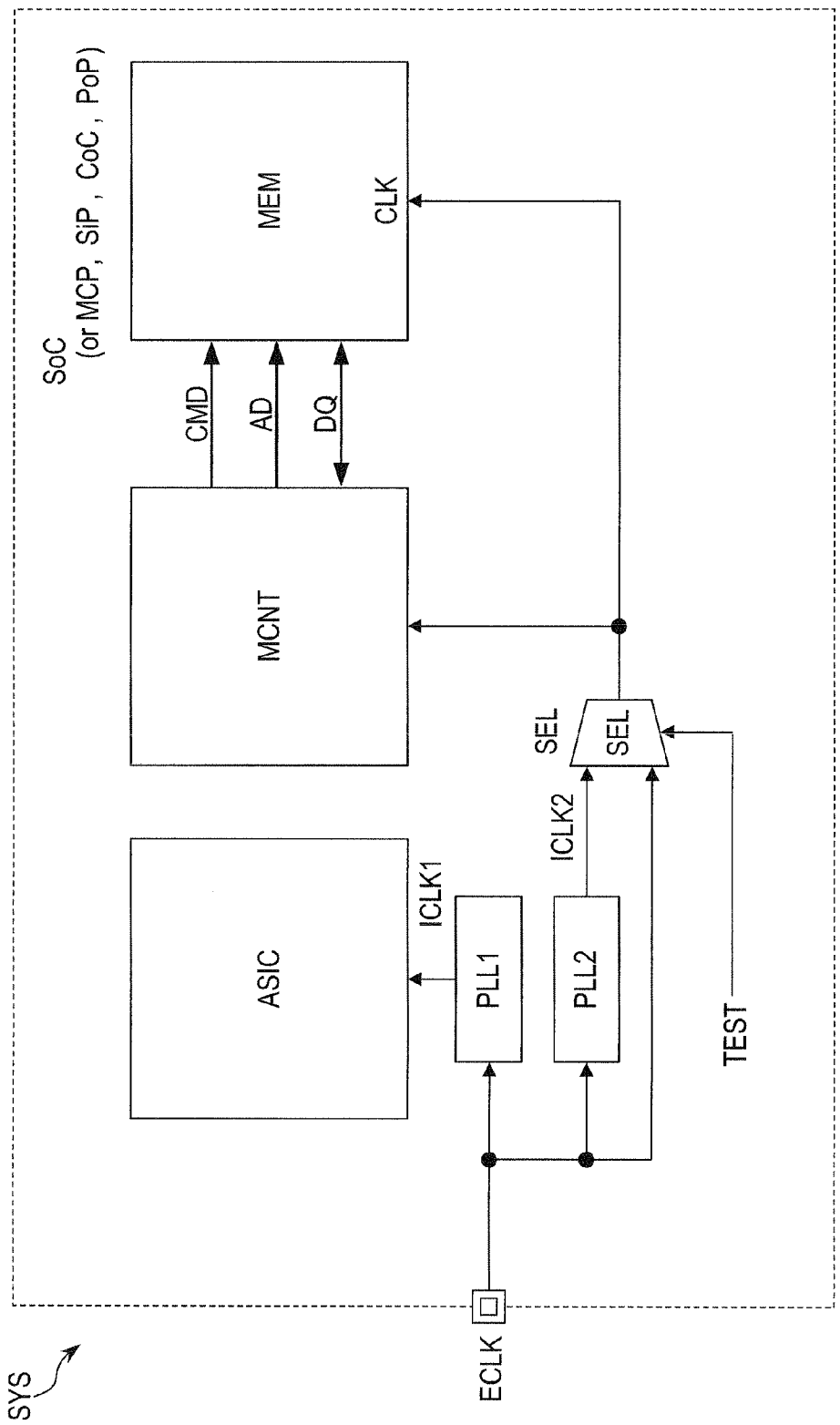
FIG. 8 illustrates an example of a system provided with the semiconductor memory illustrated in FIGS. 1 and 2 in accordance with an exemplary aspect of the invention.

FIG. 8 illustrates a system provided with the semiconductor memory illustrated in FIGS. 1 and 2 in accordance with an exemplary aspect of the invention. The system SYS may illustrate at least one portion of a portable device, such as a mobile phone or handheld game console, for example. The system SYS may also be at least one portion of a computer apparatus, such as a video recorder or personal computer. In the aspect to be hereinafter described, the semiconductor memory MEM is provided in a system SYS identical to that illustrated in FIG. 8.

The system SYS includes a system-on-a-chip (SoC). Alternatively, the system SYS may be a multi-chip package (MCP), a system-in-a-package (SiP), a chip-on-a-chip (CoC), a package-on-a-package (PoP), or a printed circuit board configuration. By way of example, the system SYS includes the semiconductor memory MEM, a memory controller MCNT that accesses the semiconductor memory MEM, an ASIC, phase-locked loops PLL1 to PLL2, and a selector SEL.

The PLL1 receives an external clock signal ECLK, and generates an internal clock signal ICLK1 having a higher frequency than the frequency of the external clock signal ECLK. The internal clock signal ICLK1 is supplied to the ASIC. The PLL2 receives an external clock signal ECLK, and generates an internal clock signal ICLK2 having a higher frequency than the frequency of the external clock signal ECLK. While in a normal operating mode where a test signal TEST is deactivated, the selector SEL supplies the internal clock signal ICLK2 to the semiconductor memory MEM and the memory controller MCNT. While in a test mode where the test signal TEST is activated, the selector SEL directly supplies the external clock signal ECLK to the semiconductor memory MEM and the memory controller MCNT. The PLL2 and the selector SEL include the functions of a clock controller circuit that changes the cycle of the clock signal CLK supplied to the semiconductor memory MEM in normal operating mode and test mode.

By way of example, the frequency of the external clock signal ECLK is 1 MHz. The frequency of the internal clock signal ICLK1 is 50 MHz. The frequency of the internal clock signal ICLK2 is 10 MHz. In normal operating mode, the semiconductor memory MEM operates by receiving a 10 MHz clock signal CLK. In test mode, the semiconductor memory MEM operates by receiving a 1 MHz clock signal CLK, and operational testing is performed. For example, the memory controller MCNT may operate as a built-in self-test (BIST) circuit that tests the semiconductor memory MEM in test mode. By directly supplying the semiconductor memory MEM with a low-frequency external clock signal ECLK during testing, the semiconductor memory MEM may be tested by a simple test circuit (i.e., the BIST circuit) while retaining the data in the dynamic memory cells MC. In addition, testing may be performed without being affected by factors such as jitter in the internal clock signal ICLK2 that occurs because of interposing the PLL2.

Herein, a clock generator circuit that generates a low-frequency test clock signal, such as a 1 MHz test clock signal, may be provided in the SoC. During test mode, the test clock signal may be selected by the selector SEL.

Figure 9:
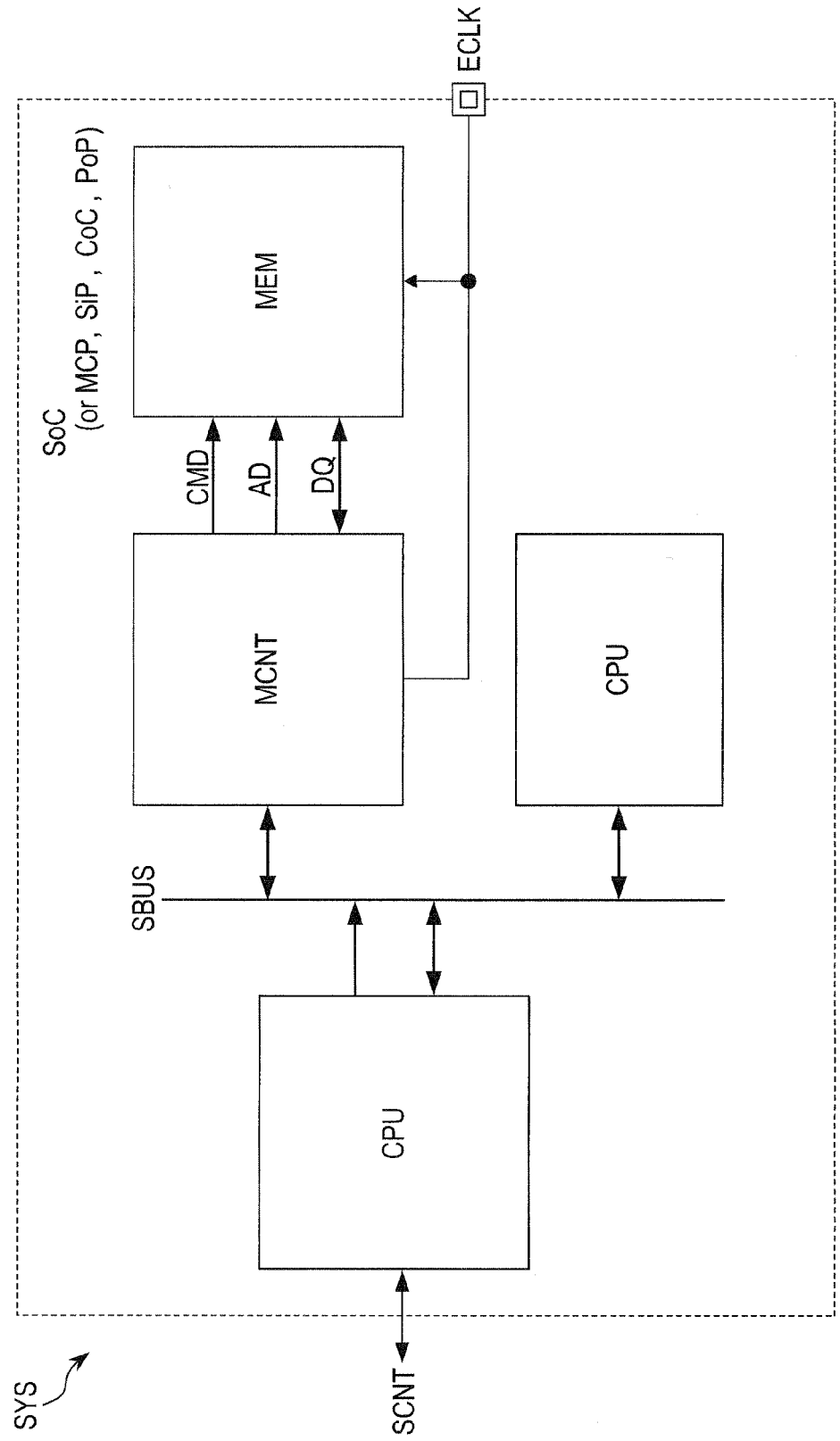
FIG. 9 illustrates another example of a system provided with the semiconductor memory illustrated in FIGS. 1 and 2 in accordance with an exemplary aspect of the invention.

FIG. 9 illustrates another example of a system provided with the semiconductor memory illustrated in FIGS. 1 and 2 in accordance with an exemplary aspect of the invention. The system SYS may illustrate at least one portion of a portable device, such as a mobile phone or handheld game console, for example. The system SYS may also be at least one portion of a computer apparatus, such as a video recorder or personal computer. In the aspect to be hereinafter described, the semiconductor memory MEM is provided in a system SYS identical to that illustrated in FIG. 9.

The system SYS includes a system-on-a-chip (SoC). Alternatively, the system SYS may be a multi-chip package (MCP), a system-in-a-package (SiP), a chip-on-a-chip (CoC), a package-on-a-package (PoP), or a printed circuit board configuration.

By way of example, the system SYS includes the semiconductor memory MEM, a memory controller MCNT that accesses the semiconductor memory MEM, an ASIC, and a CPU that controls the overall system. The CPU, the memory controller MCNT, and the ASIC are coupled to each other by means of a system bus SBUS. The SoC is coupled on the upper side of the system via an external bus SCNT. Other peripheral circuit chips may also be coupled to the system bus SBUS.

In order to access the semiconductor memory MEM, the CPU outputs to the memory controller MCNT readout packets (i.e., readout access requests) and write packets (i.e., write access requests). In normal operating mode, the memory controller MCNT outputs to the semiconductor memory MEM a command signal CMD, an address signal AD, and a write data signal DQ based on instructions from the CPU, while also receiving a readout data signal DQ from the semiconductor memory MEM. In test mode, the memory controller MCNT operates as a BIST circuit that tests the semiconductor memory MEM.

Herein, the command signal CMD and the address signal AD may also be directly output from the CPU to the semiconductor memory MEM, without providing a memory controller MCNT in the system SYS. Also, the system SYS may include just the CPU and the semiconductor memory MEM. In this case, the ASIC is formed in a user logic region inside the CPU. Additionally, the CPU includes the functions of the memory controller described above.

The semiconductor memory MEM and the memory controller MCNT operate by receiving an external clock signal ECLK from outside the system SYS. For example, the external clock signal ECLK may be 10 MHz in normal operating mode, and 1 MHz in test mode. In other words, in test mode, testing of the semiconductor memory MEM is performed at a 1 MHz frequency. By lowering the frequency of the clock signal, the semiconductor memory MEM may be tested while retaining the data in the dynamic memory cells MC.

FIG. 10 illustrates an operation of the semiconductor memory MEM illustrated in FIG. 2 in accordance with an exemplary aspect of the invention. Refresh operations will be described. As illustrated in FIG. 6, access operations in response to the access request signal ACTP are executed in sync with the rising edge of the clock signal CLK. FIG. 10 illustrates an example wherein the refresh request signal RFACTP is generated every four clock cycles.

In actual operation, the refresh address counter 16 increments the refresh address signals RFA11 to RFA0 (corresponding to IRA11 to IRA0) by 1 in response to the refresh request signal RFACTP. In order to simplify explanation, it is assumed herein that the refresh address signals RFA11 to RFA8 are updated in response to the refresh request signal RFACTP. The numeric values illustrated at the ends of the word lines WL indicate the numbers of the memory blocks RBLK0 to RBLK15 in response to the refresh request signal RFACTP. The values of the refresh address signals RFA indicate the numbers of the memory blocks RBLK0 to RBLK15.

When the counter values XAC3 to XAC0 are "0", the clock cycle is "C". In this case, the word line WL of one memory block RBLK is activated for every refresh request signal RFACTP, and the dynamic memory cells MC coupled to the one word line WL are refreshed. The activated word line WL is indicated by the row address signals IRA7 to IRA0. When the counter values XAC3 to XAC0 are "1", the clock cycle is "2C". In this case, the row address signal IRA11 is degenerated. The word lines WL of two memory blocks RBLK are simultaneously activated for every refresh request signal RFACTP, and the dynamic memory cells MC are refreshed. In other words, two word lines WL are selected at the same time, and refresh operations are executed.

When the counter values XAC3 to XAC0 are any from "2" to "3", the clock cycle is "4C". In this case, the row address signals IRA11 to IRA10 are degenerated. The word lines WL of four memory blocks RBLK are simultaneously activated for every refresh request signal RFACTP, and the dynamic memory cells MC are refreshed. In other words, four word lines WL are selected at the same time, and refresh operations are executed. When the counter values XAC3 to XAC0 are any from "4" to "7", the clock cycle is "8C". In this case, the row address signals IRA11 to IRA9 are degenerated. The word lines WL of eight memory blocks RBLK are simultaneously activated for every refresh request signal RFACTP, and the dynamic memory cells MC are refreshed. In other words, eight word lines WL are selected at the same time, and refresh operations are executed.

When the counter values XAC3 to XAC0 are any from "8" to "15", the clock cycle is "16C". In this case, the row address signals IRA11 to IRA8 are degenerated. The word lines WL of 16 memory blocks RBLK are simultaneously activated for every refresh request signal RFACTP, and the dynamic memory cells MC are refreshed. In other words, 16 word lines WL are selected at the same time, and refresh operations are executed.

By means of the above, all of the memory blocks RBLK are selected and refresh operations are executed within 64 clock cycles, regardless of the values of the counter values XAC3 to XAC0. When the number of word lines WL per memory block RBLK is 256, all dynamic memory cells MC of the semiconductor memory MEM may be refreshed within 16 k clock cycles. In other words, data in the dynamic memory cells MC may be retained, even when the clock cycle is lengthened due to a test mode or similar factor. Herein, when the word lines WL of a plurality of memory blocks RBLK are activated in response to a refresh request signal RFACTP, the activation timings of individual word lines WL may be slightly offset from one another. In so doing, the peak current that accompanies activation of the word lines WL may be decreased.

Thus, in the present aspect, advantages may be obtained that are similar to those of the aspect described earlier. Furthermore, in the present aspect, when the clock cycle is long, at least one bit of the row address signals IRA8 to IRA11 are degenerated, and a plurality of word lines WL are selected at the same time. In so doing, the number of selected word lines WL within a given time period may remain continuous, and the dynamic memory cells MC coupled to the word lines WL may be refreshed, without depending on the clock cycle. As a result, data in the dynamic memory cells MC is retained, without depending on the clock cycle.

When the clock cycle is long, the logical level of the complementary pre-decode signals RAX and RAX are set to the same level, which causes the word lines WL of respectively different memory blocks RBLK to be selected at the same time. When the clock cycle is long, the bit-pairs of the complementary pre-decode signals RAZ11 to RAZ8 and RAX11 to RAX8 for selecting the memory blocks RBLK0 to RBLK15 are set high. In so doing, refresh operations are executed with only one word line WL per memory block RBLK being activated. Consequently, the selection of multiple word lines WL in the same memory block RBLK at the same time may be suppressed, and destruction of the data stored in the dynamic memory cells MC may be suppressed.

Figure 11:
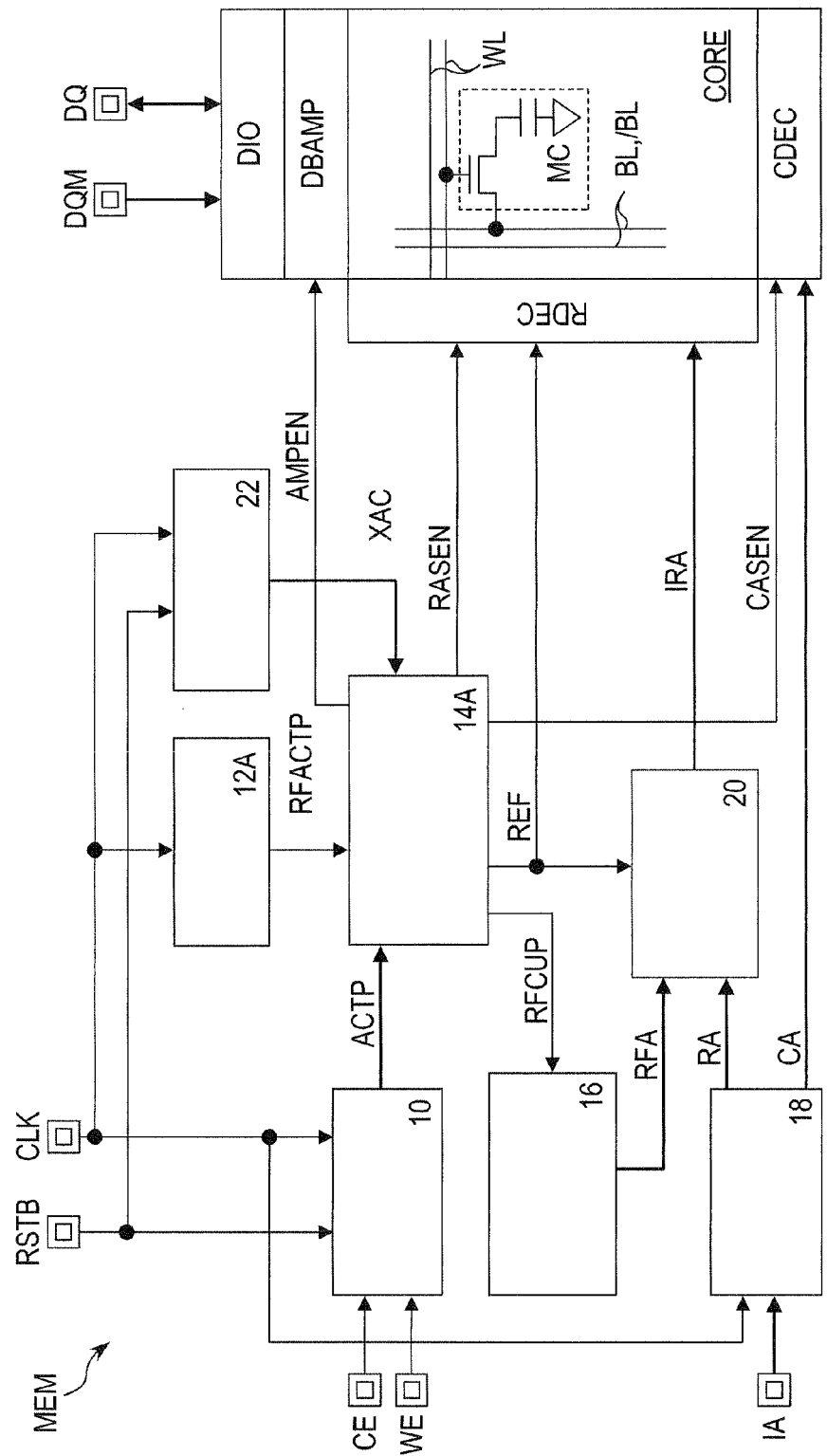
FIG. 11 illustrates third semiconductor memory in accordance with an exemplary aspect of the invention.

FIG. 11 illustrates a third semiconductor memory in accordance with an exemplary aspect of the invention. Elements identical to those described in the foregoing aspects are indicated by identical reference symbols, and detailed description of such elements is hereinafter omitted. In the present aspect, a clock counter 12A and a core controller circuit 14A are formed instead of the clock counter 12 and the core controller circuit 14 in FIG. 2. The counter values XAC3 to XAC0 are supplied to the core controller circuit 14A from the clock cycle counter 22. The clock counter 12A counts pulses of the clock signal CLK, and outputs the refresh request signal RFACTP each time a certain number of clock pulses is counted. The refresh request signal RFACTP is generated in sync with the rising edge of the clock signal CLK. In addition, the row decoder RDEC differs from that illustrated in FIG. 2. Other aspects of the configuration are identical to that illustrated in FIG. 2.

Figure 12:
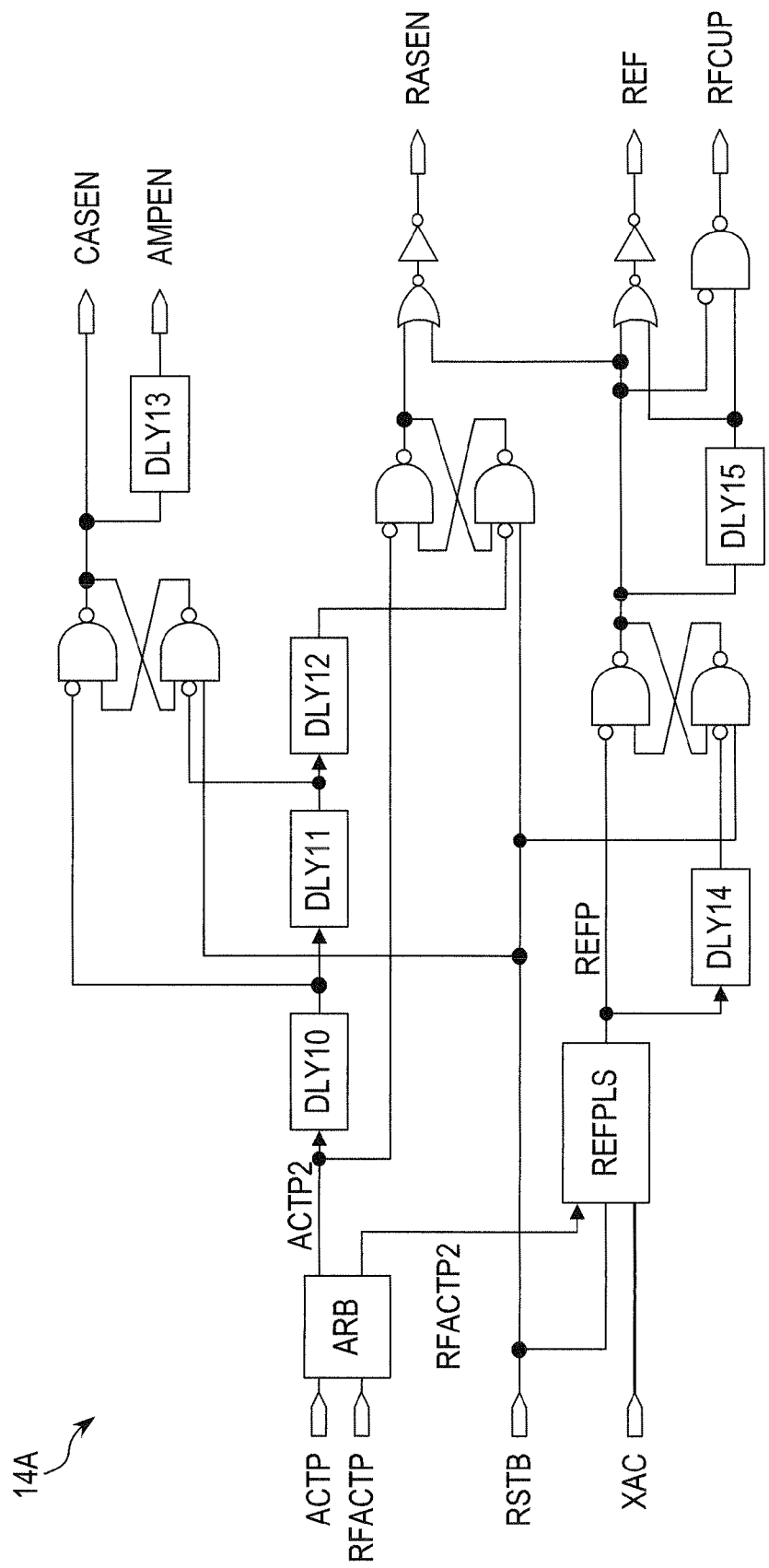
FIG. 12 illustrates an example of the core controller circuit illustrated in FIG. 11 in accordance with an exemplary aspect of the invention.

FIG. 12 illustrates an example of the core controller circuit 14A illustrated in FIG. 11 in accordance with an exemplary aspect of the invention. The core controller circuit 14A includes the core controller circuit 14 illustrated in FIG. 5, with the addition of an arbiter ARB and a refresh pulse generator circuit REFPLS. The core controller circuit 14A includes the functions of a refresh controller circuit, which increases the number of dynamic memory cells MC to refresh in response to a refresh request signal RFACTP when the clock cycle is long.

When an access request signal ACTP and a refresh request signal RFACTP occur in the same clock cycle, the arbiter ARB first outputs an access request signal ACTP2, and outputs a refresh request signal RFACTP2 in the next clock cycle. In addition, when the access request signal ACTP and the refresh request signal RFACTP are not competing, the arbiter ARB outputs an access request signal ACTP2 in response to an access request signal ACTP, and outputs a refresh request signal RFACTP2 in response to a refresh request signal RFACTP. The semiconductor memory MEM may also receive access commands every two clock cycles.

The refresh pulse generator circuit REFPLS generates a refresh request signal REFP at least once in response to a refresh request signal RFACTP2. The number of generated refresh request signals REFP changes according to the counter values XAC3 to XAC0. Herein, the access control signal RASEN functions as a refresh control signal for refreshing the dynamic memory cells MC in response to the refresh signal REF. The logic circuit that generates the access control signal RASEN includes the functions of a control signal generator circuit, which generates a refresh control signal.

Figure 13:
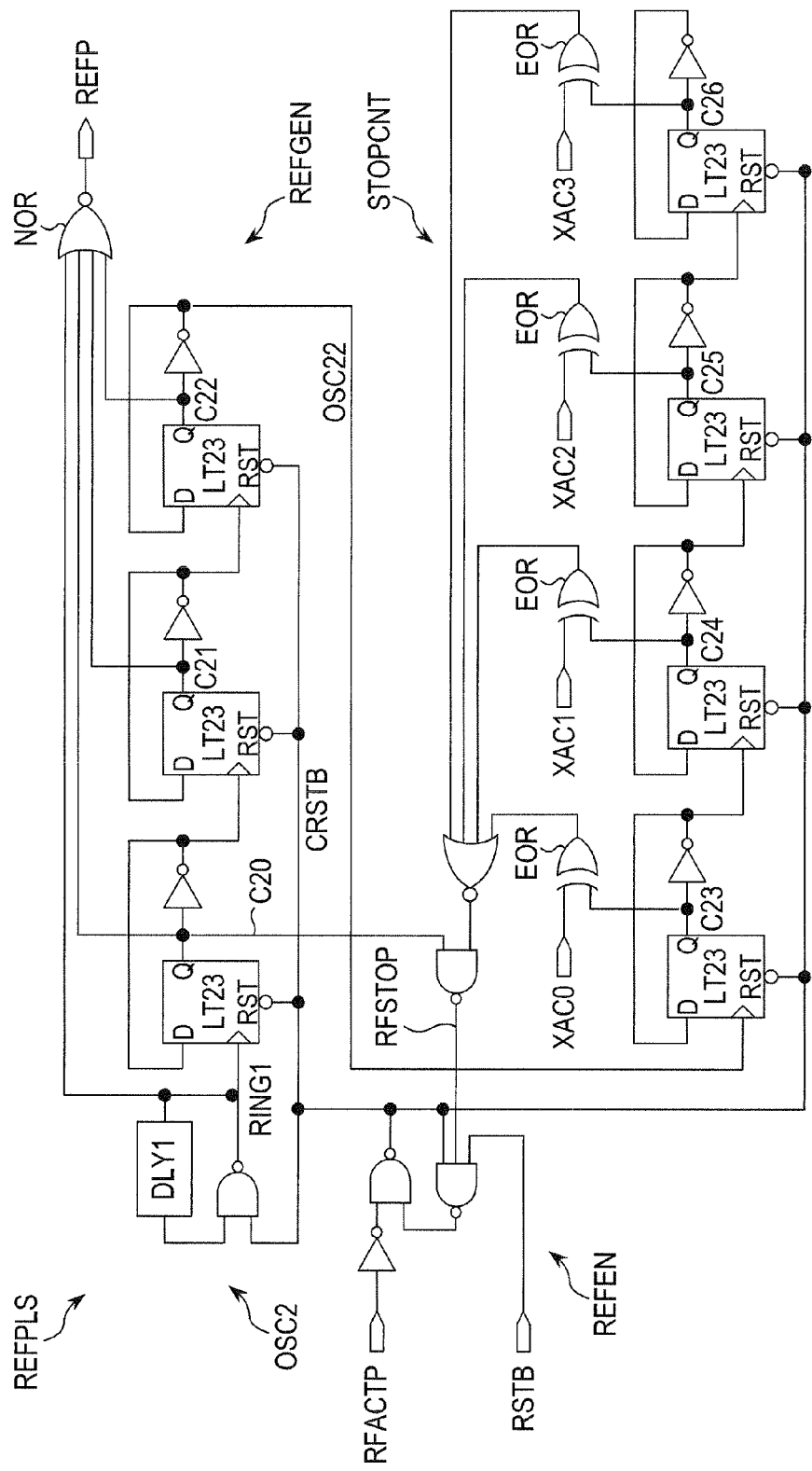
FIG. 13 illustrates an example of the refresh controller circuit illustrated in FIG. 12 in accordance with an exemplary aspect of the invention.

FIG. 13 illustrates an example of the refresh pulse generator circuit REFPLS illustrated in FIG. 12 in accordance with an exemplary aspect of the invention. The refresh pulse generator circuit REFPLS includes a refresh generator circuit REFGEN, a refresh pulse counter RPCOUNT, and a stop control circuit STOPCNT. The refresh generator circuit REFGEN includes an oscillator OSC2, three latch circuits LT20 to LT22, and a NOR gate that outputs the refresh request signal REFP. The oscillator OSC2 feeds the output of a NAND gate back into one of the inputs of the NAND gate via the delay circuit DLY1. When a high reset signal CRSTB is received at the other input of the NAND gate, the oscillator OSC2 generates an oscillating signal RING1. When the reset signal CRSTB is low, the oscillating signal RING1 is fixed at a high level. The delay time of the delay circuit DLY1 is the same delay time of the delay circuit DLY1 in the clock cycle counter 22 illustrated in FIG. 3. For this reason, the period of the oscillating signal RING1 is the same as the period of the oscillating signal RING0.

The latch circuits LT20 to LT22 are coupled in series. The latch circuits LT20 to LT22 output signals C20 to C22 obtained by successively dividing the oscillating signal RING1. The latch circuit LT20 and LT21 to LT22 receive, at their data inputs, signals obtained by inverting the logic of the division signals C20 and C21 to C22, respectively. The latch circuits LT21 and LT22 receive, at their data inputs, signals obtained by inverting the logic of the division signals C20 and C21, respectively.

When the logical level of all division signal C20 to C22 is low, the NOR gate generates the refresh request signal REFP in sync with the falling edge of the oscillating signal RING1. The refresh generator circuit REFGEN outputs an oscillating signal OSC22 from the latch circuit LT22 to the refresh pulse counter RPCOUNT.

The refresh pulse counter RPCOUNT includes latch circuits LT23 to LT26 coupled in series. The latch circuit LT23 receives the oscillating signal OSC22 from the refresh generator circuit REFGEN. The latch circuits LT23 to LT26 are coupled to each other in the same way as the latch circuits LT20 to LT22. The latch circuits LT20 to LT26 are reset to logical 0 upon receiving a low reset signal CRSTB. The logical values of the division signal C23 to C26 output from the latch circuits LT23 to LT26 indicate the number of pulses in the oscillating signal OCS22.

The stop control circuit STOPCNT includes EOR gates corresponding to the latch circuits LT23 to LT26, as well as a refresh enable circuit REFEN. Each EOR gate outputs low when the logical level of its division signal, such as C23, matches the logical level of the counter value XAC, such as XAC0. In so doing, a refresh stop signal RFSTOP is output when the logic of the division signals C23 to C26 have become substantially equal to the logic of the counter values XAC0 to XAC3. In other words, the refresh stop signal RFSTOP is activated at the low level in sync with the division signal C21 when all EOR gates output low.

During the period in which the reset signal RSTB and the refresh stop signal RFSTOP are high, the refresh enable circuit REFEN is reset in sync with the refresh request signal RFACTP, and sets the reset signal CRSTB to high. While the reset signal CRSTB is high, the refresh enable circuit REFEN is reset in sync with the low level of the reset signal RSTB or the refresh stop signal RFSTOP, and sets the reset signal CRSTB to low.

In so doing, the stop control circuit STOPCNT outputs an oscillating signal OSC22 the number of times indicated by the counter values XAC3 to XAC0, in response to the refresh request signal RFACTP. The counter values XAC3 to XAC0 correspond to the clock cycle. The generation cycles of the oscillating signal OSC22 and the refresh request signal REFP are substantially equal. Consequently, a refresh request signal REFP is output the number of times indicated by the counter values XAC3 to XAC0, in response to the refresh request signal RFACTP. The generation cycle of the refresh request signal REFP is substantially equal to the cycle of the oscillating signal OSC0 of the clock cycle counter 22 illustrated in FIG. 2.

Figure 14:
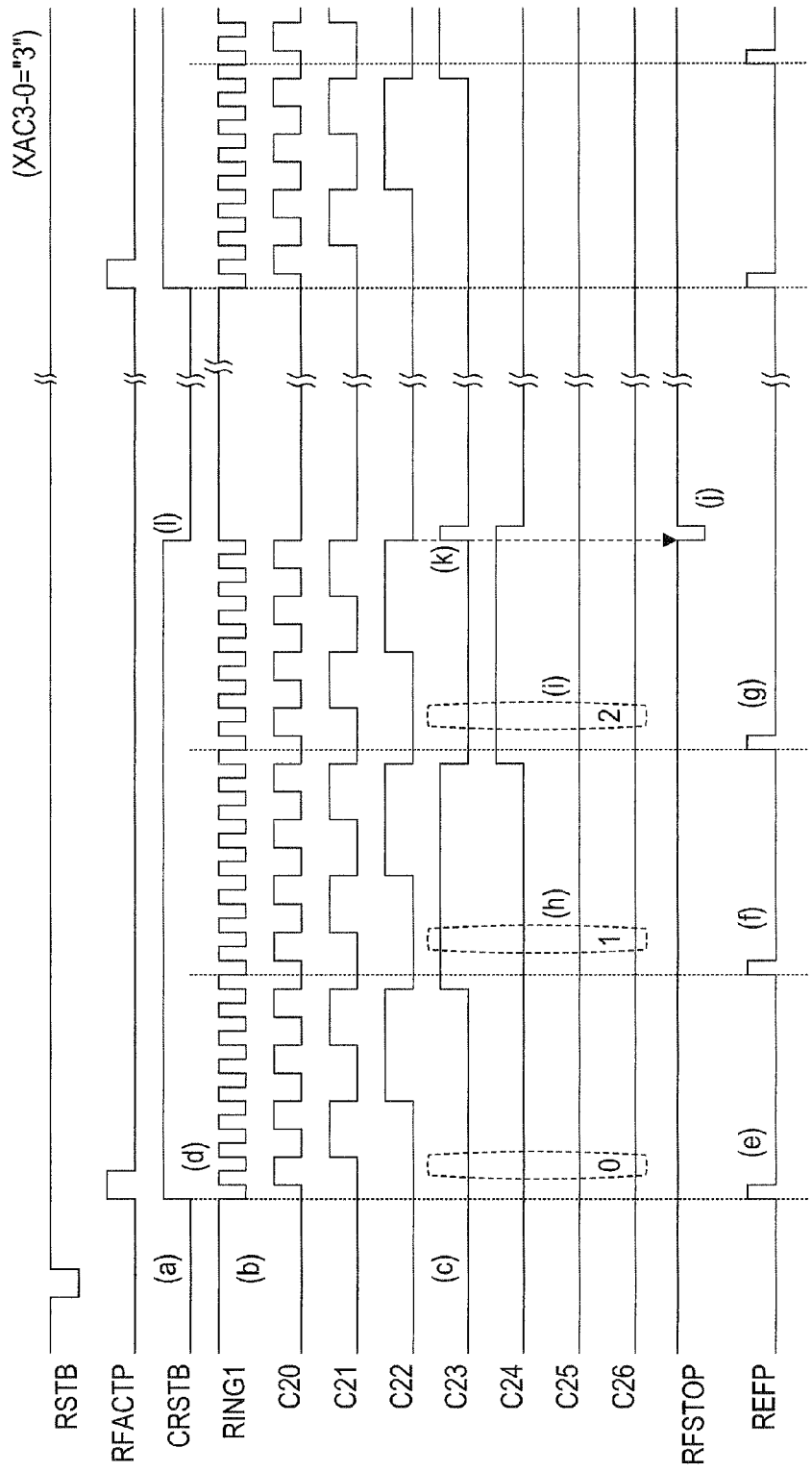
FIG. 14 illustrates an operation of the refresh controller circuit illustrated in FIG. 13 in accordance with an exemplary aspect of the invention.

FIG. 14 illustrates an operation of the refresh pulse generator circuit REFPLS illustrated in FIG. 13 in accordance with an exemplary aspect of the invention. In this example, the counter values XAC3 to XAC0 are set to "3". As illustrated at (a) in FIG. 14, the reset signal CRSTB is kept low by the reset signal RSTB. As illustrated at (b) and (c) in FIG. 14, as a result of the low reset signal CRSTB, the oscillating signal RING1 is set high, and the division signals C20 to C26 are set low.

As illustrated at (d) in FIG. 14, the reset signal CRSTB changes to high in sync with the refresh request signal RFACTP, and generation of both the oscillating signal RING1 and the division signals C20 to C26 is initiated. As illustrated at (e) in FIG. 14, since the division signals C20 to C26 are reset to low, the first refresh request signal REFP is generated in sync with the refresh request signal RFACTP. As illustrated at (f) and (g) in FIG. 14, when the division signal C20 to C22 are low, a refresh request signal REFP is generated in sync with the oscillating signal RING1. In this example, three refresh request signals REFP are generated in response to a single refresh request signal RFACTP, the number of refresh request signals REFP being substantially equal to the value of the counter values XAC3 to XAC0. In so doing, three word lines WL are successively selected, and refresh operations are successively executed for the dynamic memory cells MC coupled to those word lines WL.

As illustrated at (j) and (k) in FIG. 14, the value of the division signals C23 to C26 successively increases (see also (h) and (i)). When the value of the division signals C23 to C26 has become "3", all EOR gates output low, and the refresh stop signal RFSTOP is output. As illustrated at (l) in FIG. 14, in response to the refresh stop signal RFSTOP, the reset signal CRSTB changes to low, and the latch circuits LT20 to LT26 are reset. Thereafter, the above operation is repeated every time a refresh request signal RFACTP is output.

Figure 15:
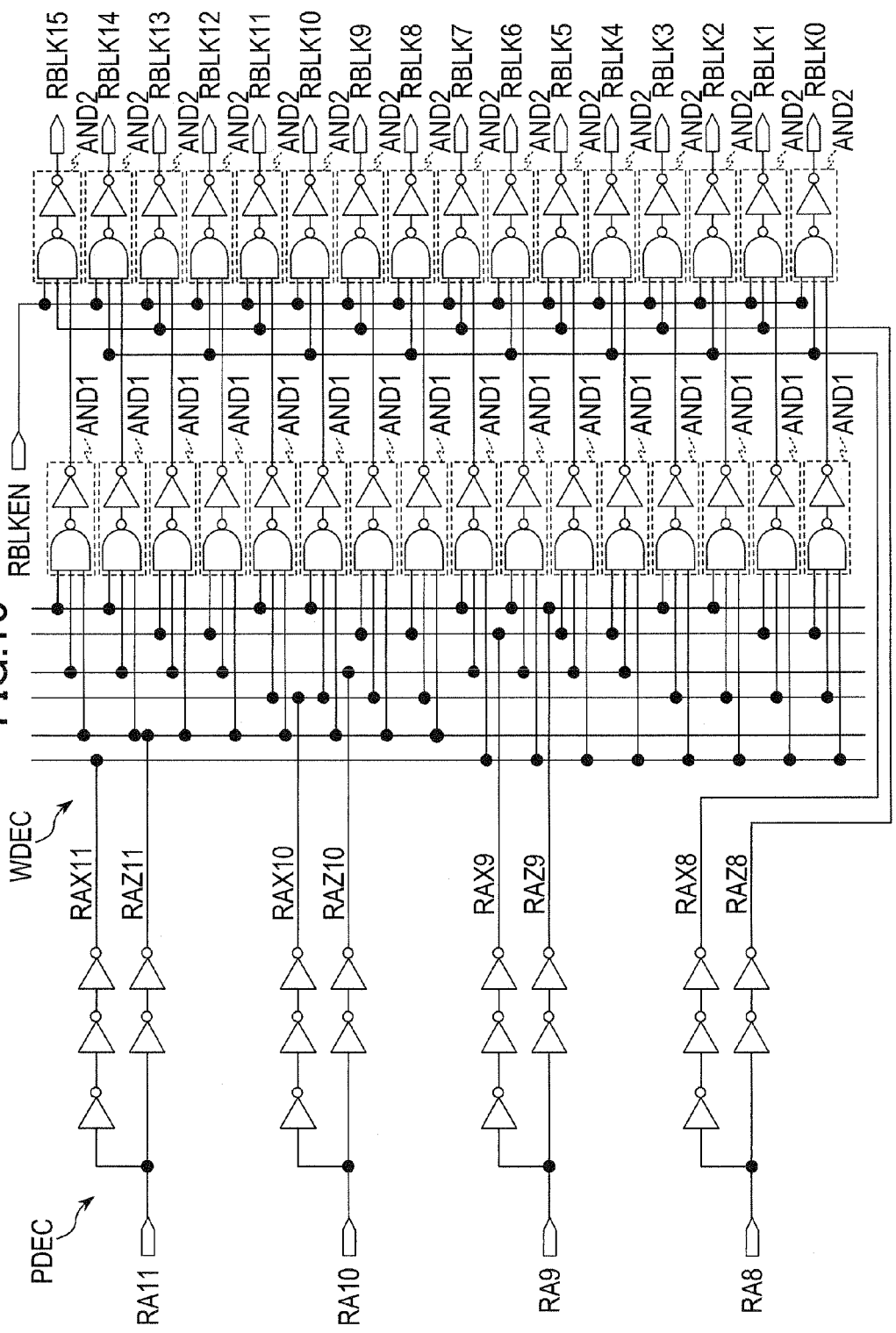
FIG. 15 illustrates an example of the row decoder illustrated in FIG. 11 in accordance with an exemplary aspect of the invention.

FIG. 15 illustrates an example of the row decoder RDEC illustrated in FIG. 11 in accordance with an exemplary aspect of the invention. Detailed description of elements identical to those described in FIG. 7 is hereinafter omitted. In the row decoder RDEC, the pre-decoder PDEC differs from that illustrated in FIG. 7. Other aspects of the configuration of the row decoder RDEC are identical to those of FIG. 7.

In the pre-decoder PDEC, the logic of the counter values XAC3 to XAC0 has been removed from that illustrated in FIG. 7. In other words, the pre-decode signals RAZ (i.e., RAZ11 to RAZ8) have the same logical levels as the row address signals IRA (i.e., IRA11 to IRA8), while the pre-decode signals RAX (i.e., RAX11 to RAX8) have the inverse logical levels of the row address signals IRA (i.e., IRA11 to IRA8). In so doing, in the row decoder RDEC, one of the memory blocks RBLK0 to RBLK15 is selected according to the row address signals IRA11 to IRA8.

Figure 16:
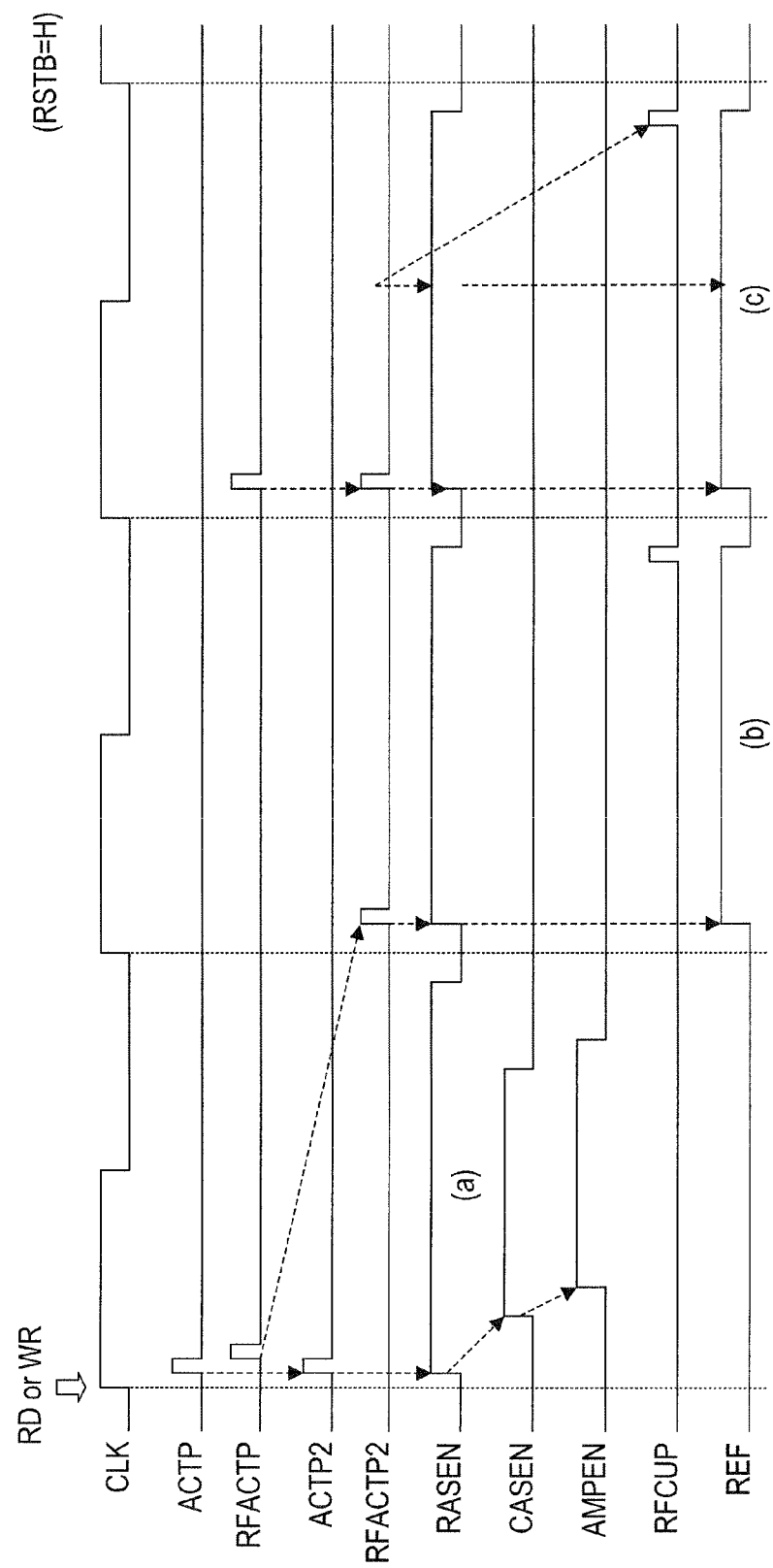
FIG. 16 illustrates an operation of the core controller circuit illustrated in FIG. 12 in accordance with an exemplary aspect of the invention.

FIG. 16 illustrates an operation of the core controller circuit 14A illustrated in FIG. 12 in accordance with an exemplary aspect of the invention. In FIG. 16 herein, the counter values XAC3 to XAC0 are "0". Detailed description of operation identical to that of FIG. 6 is hereinafter omitted. As illustrated at (a) in FIG. 16, when the access request signal ACTP and the refresh request signal RFACTP are competing, access operations corresponding to the access request signal ACTP2 are executed in the first clock cycle. As illustrated at (b) in FIG. 16, refresh operations corresponding to the refresh request signal RFACTP2 are executed in the next clock cycle. In the clock cycle when refresh operations are executed, the semiconductor memory MEM may also externally output a wait signal announcing that refresh operations are being executed.

As illustrated at (c) in FIG. 16, when just the refresh request signal RFACTP occurs, refresh operations are executed in that clock cycle. Note that in actual operation, a refresh request signal RFACTP does not occur in succession over consecutive clock cycles.

Figure 17:
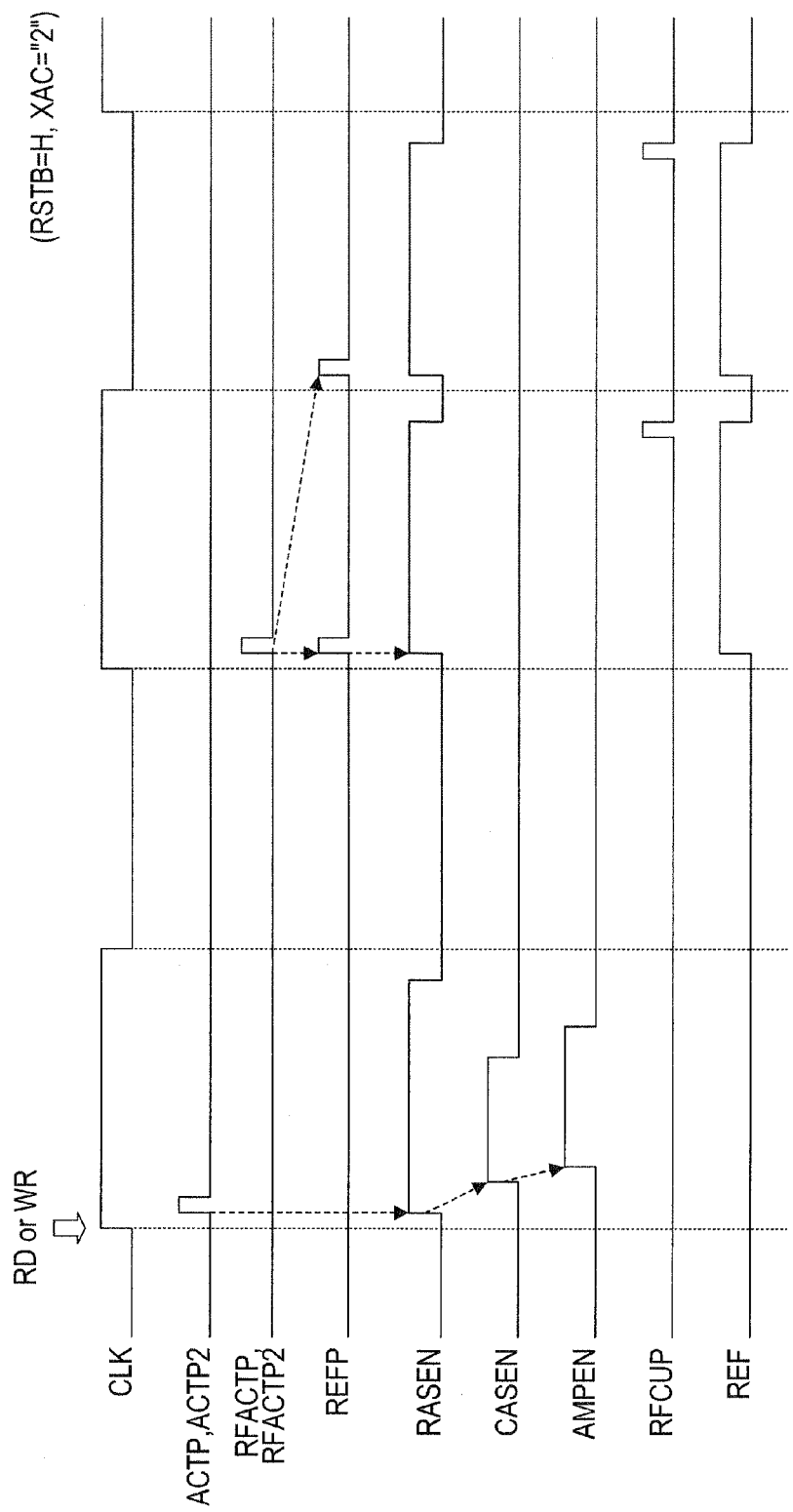
FIG. 17 illustrates another operation of the core controller circuit illustrated in FIG. 12 in accordance with an exemplary aspect of the invention.

FIG. 17 illustrates another operation of the core controller circuit 14A illustrated in FIG. 12 in accordance with an exemplary aspect of the invention. Detailed description of operation identical to that of FIG. 16 is hereinafter omitted. In this example, the access request signal ACTP occurs in the first clock cycle, and the refresh request signal RFACTP occurs in the next clock cycle. FIG. 17 illustrates operation when the counter values XAC3 to XAC0 are "2".

When the counter values XAC3 to XAC0 are "2", two refresh operations are executed in response to the refresh request signal RFACTP. When the counter values XAC3 to XAC0 are "2", the cycle of the clock signal CLK is two or more times that of FIG. 16. It is thus possible for the refresh signal REF to occur twice within one half-cycle of the clock signal CLK, and two refresh operations are executed consecutively.

Figure 18:
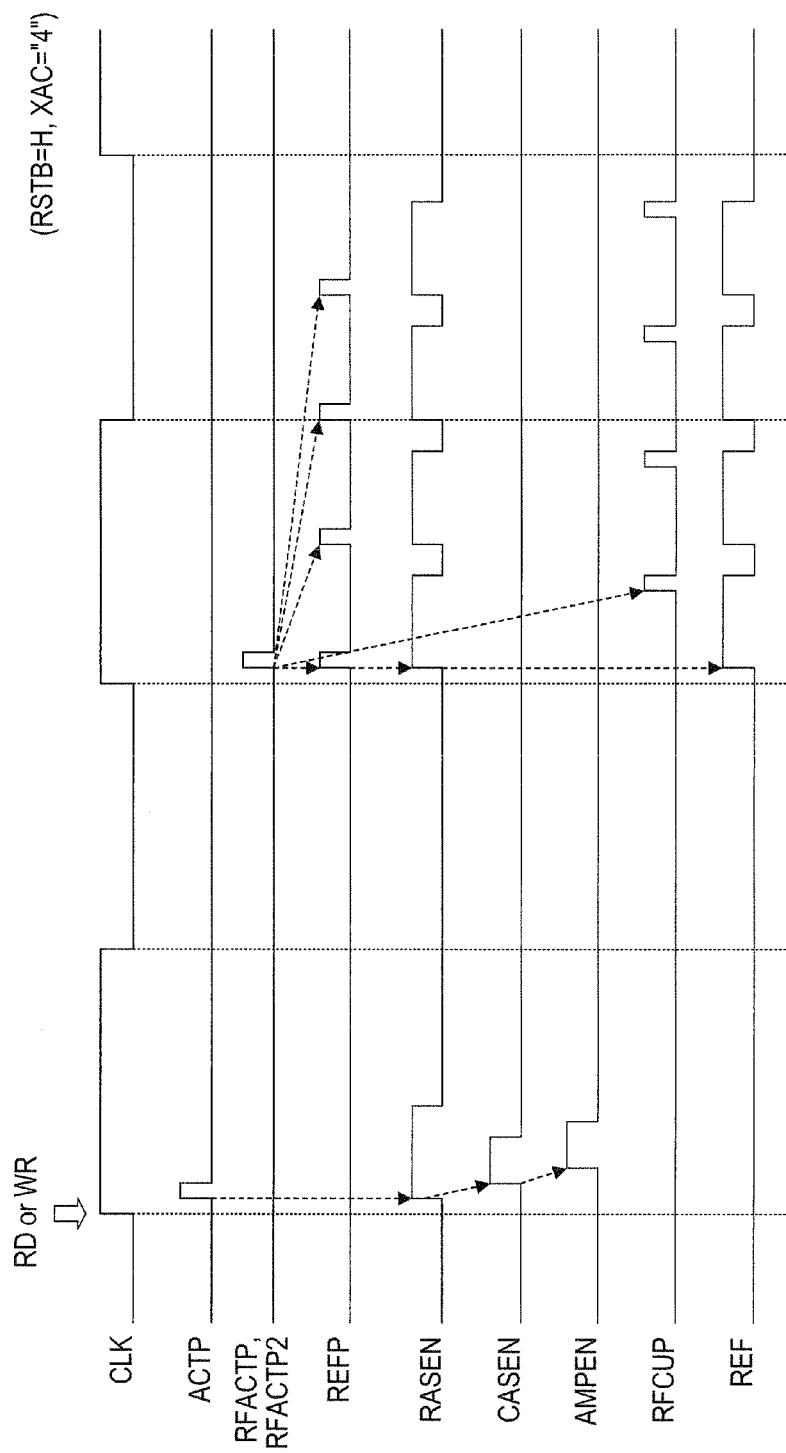
FIG. 18 illustrates yet another operation of the core controller circuit illustrated in FIG. 12 in accordance with an exemplary aspect of the invention.

FIG. 18 illustrates yet another operation of the core controller circuit 14A illustrated in FIG. 12 in accordance with an exemplary aspect of the invention. Detailed description of operation identical to that of FIG. 16 is hereinafter omitted. In this example, the access request signal ACTP occurs in the first clock cycle, and the refresh request signal RFACTP occurs in the next clock cycle. FIG. 18 illustrates operation when the counter values XAC3 to XAC0 are "4". When the counter values XAC3 to XAC0 are "4", the cycle of the clock signal CLK is four or more times that of FIG. 16. It is thus possible for the refresh signal REF to occur four times within one half-cycle of the clock signal CLK, and four refresh operations are executed consecutively.

Figure 19:
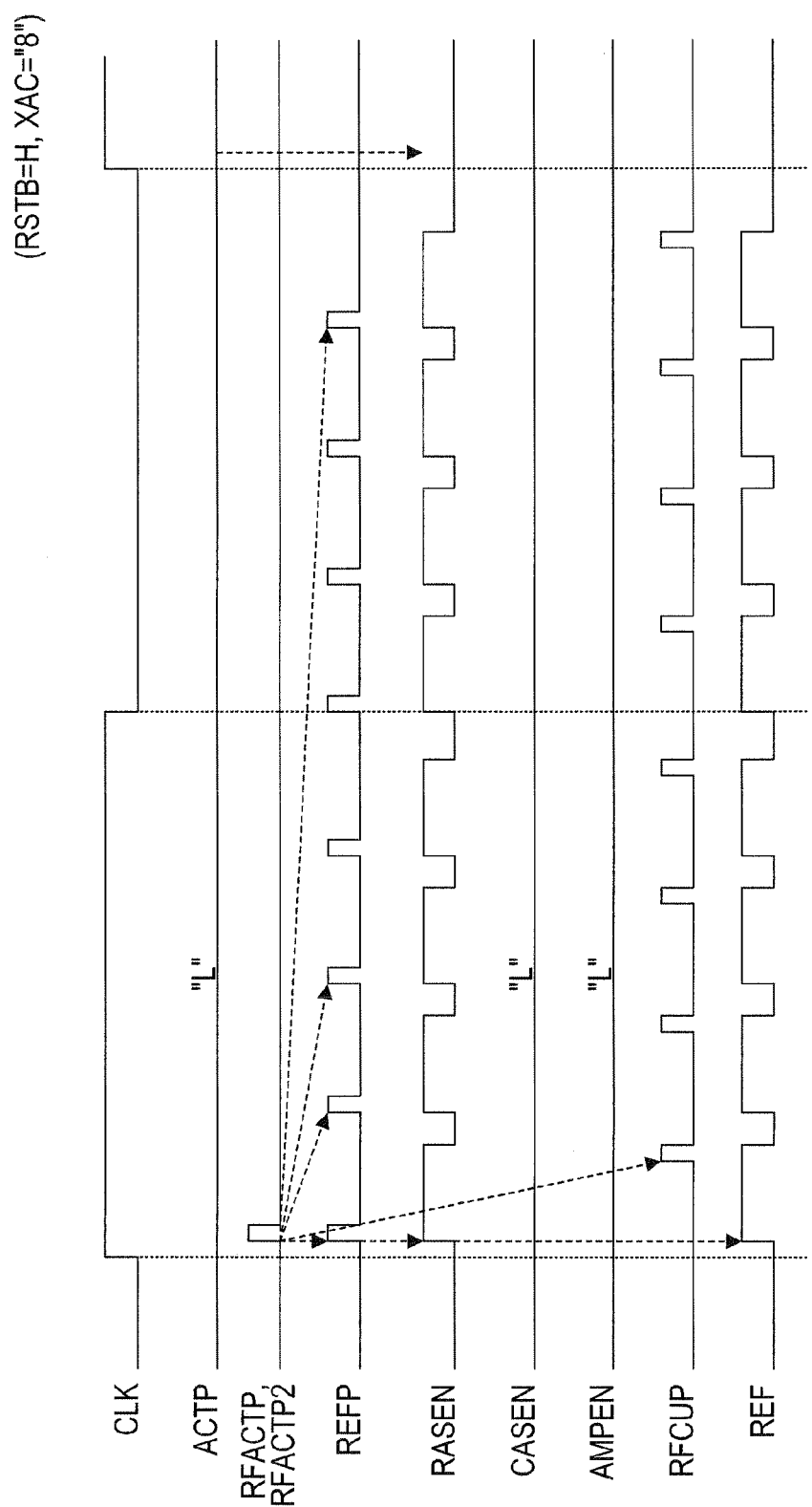
FIG. 19 illustrates still yet another operation of the core controller circuit illustrated in FIG. 12 in accordance with an exemplary aspect of the invention.

FIG. 19 illustrates still yet another operation of the core controller circuit 14A illustrated in FIG. 12 in accordance with an exemplary aspect of the invention. Detailed description of operation identical to that of FIG. 16 is hereinafter omitted. In this example, only the refresh request signal RFACTP occurs in the first clock cycle. For this reason, the access request signal ACTP, as well as the access control signals CASEN and AMPEN, are kept at the low level L. FIG. 19 illustrates operation when the counter values XAC3 to XAC0 are "8". When the counter values XAC3 to XAC0 are "8", the cycle of the clock signal CLK is eight or more times that of FIG. 16. It is thus possible for the refresh signal REF to occur eight times within one half-cycle of the clock signal CLK, and eight refresh operations are executed consecutively.

Figure 20:
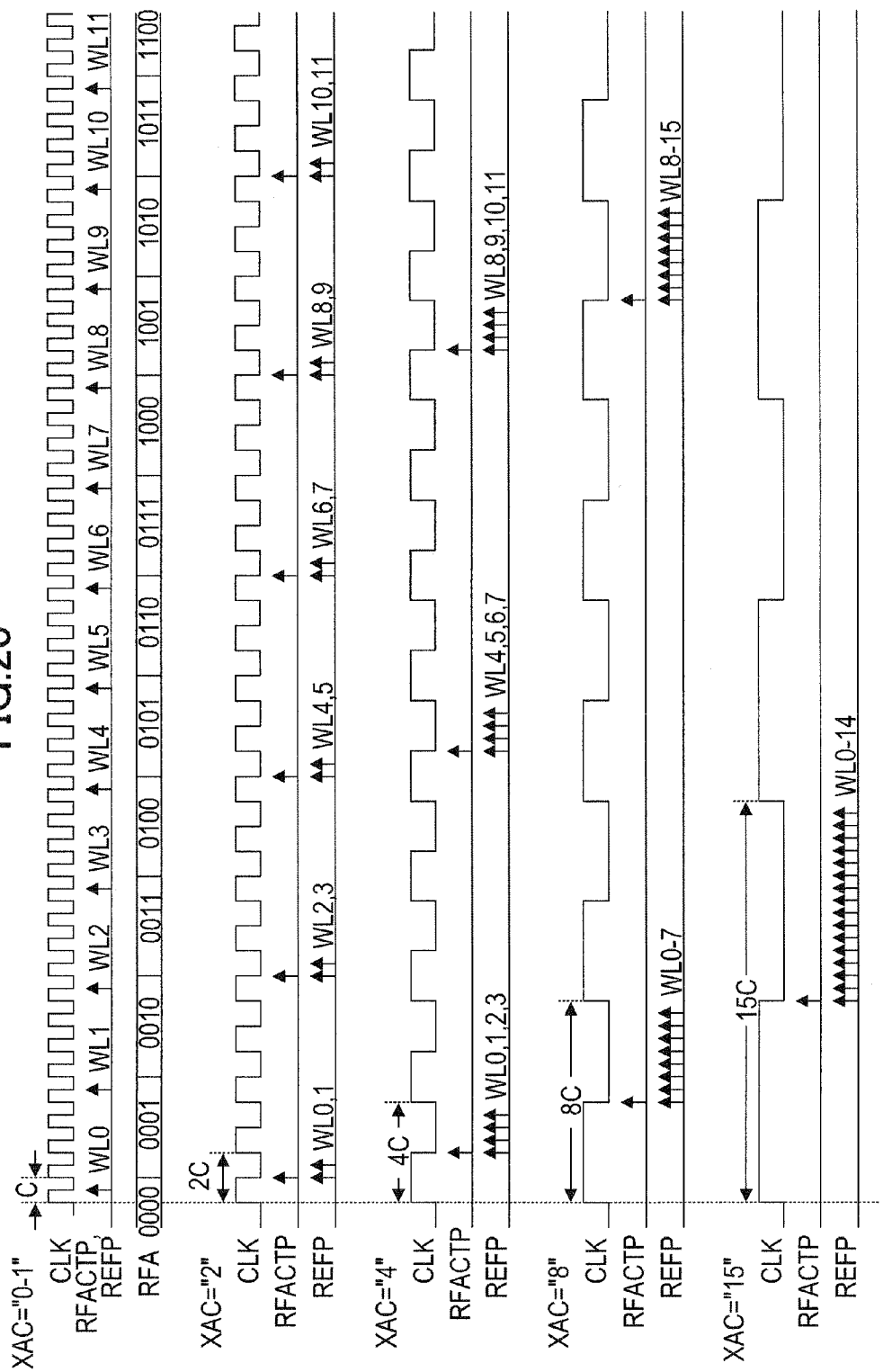
FIG. 20 illustrates an operation of the semiconductor memory illustrated in FIG. 11 in accordance with an exemplary aspect of the invention.

FIG. 20 illustrates an operation of the semiconductor memory illustrated in FIG. 11 in accordance with an exemplary aspect of the invention. Detailed description of operation identical to that of FIG. 10 is hereinafter omitted. In order to simplify explanation, only refresh operations will be described. FIG. 20 illustrates an example wherein the refresh request signal RFACTP occurs every four clock cycles. In actual operation, the refresh address counter 16 increments the refresh address signals RFA11 to RFA0 (corresponding to IRA11 to IRA0) by 1 in response to the refresh request signal RFACTP. Herein, it is assumed that the refresh address signals RFA11 to RFA8 are updated in response to the refresh request signal RFACTP. The numeric values illustrated at the ends of the word lines WL indicate the numbers of the memory blocks RBLK0 to RBLK15. The values of the refresh address signals RFA indicate the numbers of the memory blocks RBLK0 to RBLK15.

When the counter values XAC3 to XAC0 are "0" or "1", the word line WL of one memory block RBLK is selected, and the dynamic memory cells MC coupled to the word line WL are refreshed. When the counter values XAC3 to XAC0 are "2", the word lines WL of two memory blocks RBLK are successively activated for each refresh request signal RFACTP, and the dynamic memory cells MC coupled to the two word lines WL are refreshed.

When the counter values XAC3 to XAC0 are "4", the word lines WL of four memory blocks RBLK are successively activated for each refresh request signal RFACTP, and the dynamic memory cells MC coupled to the four word lines WL are refreshed. When the counter values XAC3 to XAC0 are "8", the word lines WL of eight memory blocks RBLK are successively activated for each refresh request signal RFACTP, and the dynamic memory cells MC coupled to the eight word lines WL are refreshed.

When the counter values XAC3 to XAC0 are "15", the word lines WL of 15 memory blocks RBLK are successively activated for each refresh request signal RFACTP, and the dynamic memory cells MC coupled to the 15 word lines WL are refreshed. By means of the above, all of the memory blocks RBLK are selected and refresh operations are executed within 64 clock cycles, regardless of the value of the counter values XAC3 to XAC0. In other words, data in the dynamic memory cells MC may be retained, even when the clock cycle is lengthened due to a test mode or similar factor.

Thus, in the present aspect, advantages may be obtained that are similar to those of the aspects described earlier. In other words, when the clock cycle is long, a plurality of word lines WL are successively selected by generating a plurality of refresh signals REF in response to a refresh request signal RFACTP. In so doing, the number of selected word lines WL within a given time period may remain continuous, and the dynamic memory cells MC coupled to the word lines WL may be refreshed, without depending on the clock cycle. As a result, data in the dynamic memory cells MC is retained, without depending on the clock cycle.

Furthermore, in the present aspect, the peak voltage during refresh operations is decreased as a result of executing refresh operations by selecting word lines WL in succession. Even in the case of generating a plurality of refresh signals REF in response to the refresh request signal RFACTP, the refresh address counter 16 is used to successively select word lines WL. For this reason, the increases in the scale of the circuitry in the semiconductor memory MEM are suppressed.

The refresh pulse generator circuit REFPLS repeatedly generates pulses in the refresh request signal REFP until a number of oscillating signals OSC22 substantially equal to the counter values XAC3 to XAC0 is generated. In so doing, the optimal number of refresh request signals REFP with respect to the clock cycle may be generated, and a focused plurality of refresh operations are executed in response to the refresh request signal RFACTP. As a result, data in the dynamic memory cells MC is retained, without depending on the clock cycle.

By executing a plurality of refresh operations within one clock cycle in response to the refresh request signal RFACTP, the semiconductor memory MEM receives access commands RD and WR in the next clock cycle. Consequently, lowering of the data transfer rate is suppressed, even in the case of executing a plurality of refresh operations in response to the refresh request signal RFACTP.

In the foregoing, an example is described with reference to FIG. 6 wherein access operations are executed in sync with the rising edge of the clock signal CLK, and refresh operations are executed in sync with the falling edge of the clock signal CLK. However, refresh operations may be executed in sync with the rising edge of the clock signal CLK, and access operations may be executed in sync with the falling edge of the clock signal CLK.

Figure 21:
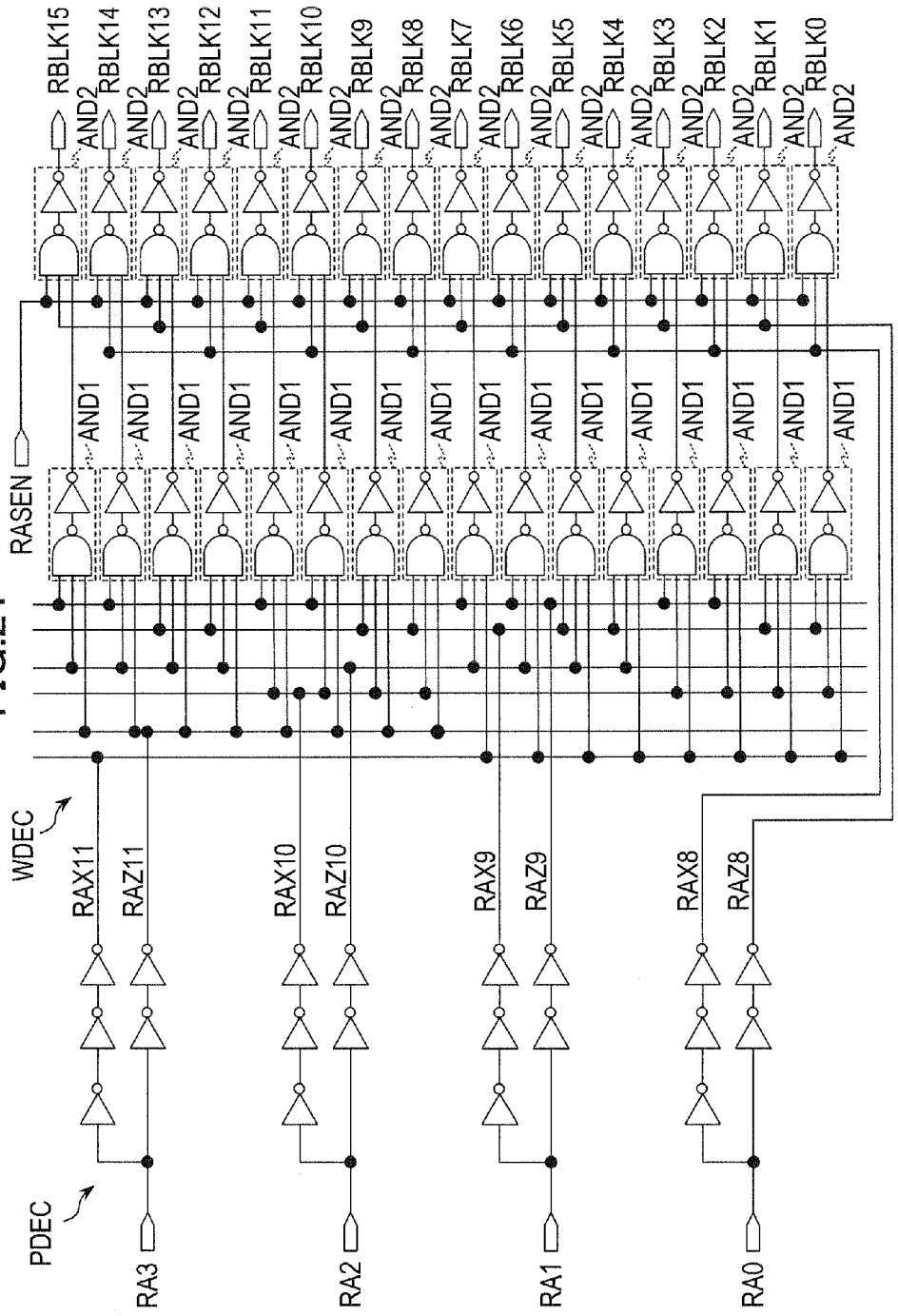
FIG. 21 illustrates a row decoder in accordance with an exemplary aspect of the invention.

By way of example, the semiconductor memory MEM illustrated in FIG. 11 is described as including a plurality of memory blocks RBLK0 to RBLK15. However, the semiconductor memory MEM illustrated in FIG. 11 may also include just one memory block. For example, if a single memory block includes 16 word lines WL0 to WL15, then as illustrated in FIG. 21, in accordance with an exemplary aspect of the invention, the row decoder RDEC receives 4-bit row address signals RA3 to RA0, and one of the 16 word lines WL0 to WL15 is selected in sync with the access control signal RASEN. In this case, the operation of the semiconductor memory MEM in FIG. 20 may be illustrated by using the numbers of the word lines WL to express both the numeric values at the ends of the word lines WL as well as the values of the refresh address signals RFA. According to the aspects disclosed in the present specification, the number of dynamic memory cells to be refreshed for each refresh request signal is increased when the clock cycle is lengthened, which enables data in the dynamic memory cells to be reliably retained, without depending on the clock cycle.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the aspects of the present invention have been described in detail, it should be understood that the various changes, substitutions, and alterations could be made hereto without departing from the spirit and scope of the invention.

What is claimed is:

1. Semiconductor memory, comprising:
   a plurality of memory cells;
   a refresh request generator circuit configured to generate a refresh request signal refreshing the plurality of memory cells based on a number of clock cycles elapsed in a clock signal;
   a clock cycle detector circuit configured to detect the clock cycle of the clock signal; and
   a refresh controller circuit configured to control a number of memory cells to refresh from among the plurality of memory cells, in accordance with the detected clock cycle.

2. The semiconductor memory according to claim 1, wherein
   the clock cycle detector circuit further detects the clock cycle during a period in which a reset signal is activated, and stores the detected clock cycle after the reset signal has been deactivated.

3. The semiconductor memory according to claim 1, further comprising:
   a plurality of word lines respectively coupled to the plurality of memory cells,
   wherein the refresh controller circuit includes a decoder circuit configured to select both word lines corresponding to a row address signal and word lines not corresponding to the row address signal, in accordance with the detected clock cycle.

4. The semiconductor memory according to claim 3, wherein the decoder circuit comprises:
   a pre-decoder configured to converting the row address signal into a first pre-decode signal and a second pre-decode signal that are in antiphase, and to set the first pre-decode signal and the second pre-decode signal to the active level in accordance with the detected clock cycle, regardless of a logical level of the row address signal; and
   a word decoder configured to select the word lines in accordance with the first pre-decode signal and the second pre-decode signal.

5. The semiconductor memory according to claim 4, further comprising:

a plurality of memory blocks including a plurality of word lines; and a refresh address counter configured to successively generate refresh address signals in response to the refresh request signal, and output the results as row address signals;

wherein the memory blocks are selected based on at least one of a most significant bits in the refresh address signals, wherein the word lines within each memory block are selected based on at least one of a least significant bits in the refresh address signals, and wherein, in accordance with the detected clock cycle, the pre-decoder sets at least one bit-pair of the complementary pre-decode signals that select the memory blocks to the active level, regardless of the logical level of the row address signals.

6. The semiconductor memory according to claim 1, wherein the refresh controller circuit comprises:

a refresh pulse generator circuit configured to generate a refresh signal to refresh the memory cells in response to the refresh request signal, and to change a number of pulses in the refresh signal in accordance with the detected clock cycle; and a control signal generator circuit configured to generate a refresh control signal refreshing the memory cells in response to each pulse of the refresh signal.

7. The semiconductor memory according to claim 6, further comprising;

a plurality of word lines coupled to the plurality of memory cells; and a refresh address counter configured to successively generate refresh address signals in response to the refresh request signal, and output results as row address signals.

8. The semiconductor memory according to claim 6, wherein the clock cycle detector circuit comprises:

an oscillating signal generator circuit configured to generate an oscillating signal having a cycle shorter than the clock cycle; and a clock counter configured to count the clock cycle in the form of the number of pulses in the oscillating signal that occur during a transition edge of the clock signal; and wherein the refresh pulse generator circuit comprises:

a refresh generator circuit configured to generate pulses in the refresh signal at the same cycle as that of the oscillating signal during the time between receiving the refresh request signal and receiving a refresh stop signal;

a refresh pulse counter configured to count the number of pulses in the refresh signal; and a stop control circuit configured to output a refresh stop signal when the number of pulses in the refresh signal counted by the refresh pulse counter matches the number of pulses corresponding to the clock cycles counted by the clock counter.

9. The semiconductor memory according to claim 1, wherein the refresh request generator circuit further generates the refresh request signal in synchronization with one of either the rising edge or the falling edge of the clock signal; and wherein the refresh pulse generator circuit further generates all pulses in the refresh signal in response to the refresh request signal within one cycle of the clock signal.

10. The semiconductor memory according to claim 9, further comprising:

a controller configured to control access to the memory cells.

11. The semiconductor memory according to claim 10, further comprising:

a clock controller circuit configured to set the cycle of the clock signal supplied to the semiconductor memory during a test mode longer than the cycle of the clock signal supplied to the semiconductor memory during a normal operating mode.

* * * * *